(12) United States Patent
Lian et al.

(10) Patent No.: US 11,568,669 B2
(45) Date of Patent: Jan. 31, 2023

(54) ULTRASONIC FINGERPRINT IDENTIFICATION CIRCUIT, DRIVING METHOD THEREOF, AND DISPLAY DEVICE

(71) Applicant: Shanghai Tianma Micro-Electronics Co., Ltd., Shanghai (CN)

(72) Inventors: Lu Lian, Shanghai (CN); Feng Lu, Shanghai (CN); Haochi Yu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 264 days.

(21) Appl. No.: 17/019,821

(22) Filed: Sep. 14, 2020

(65) Prior Publication Data
US 2020/0410199 A1 Dec. 31, 2020

(30) Foreign Application Priority Data
Jun. 18, 2020 (CN) .......................... 202010558026.3

(51) Int. Cl.
*G06V 40/13* (2022.01)
*G01S 7/539* (2006.01)
(Continued)

(52) U.S. Cl.
CPC .......... *G06V 40/1306* (2022.01); *G01S 7/539* (2013.01); *G01S 15/8925* (2013.01);
(Continued)

(58) Field of Classification Search
CPC ............... G06K 9/0002; G06K 9/0004; G06V 40/1306; G06V 40/1318; G06F 3/041; G06F 3/042; H03K 17/72; H01L 29/744
See application file for complete search history.

(56) References Cited

U.S. PATENT DOCUMENTS 6,162,654 A * 12/2000 Kawabe ............ G02F 1/133512
349/110
6,887,759 B2 * 5/2005 Guyader ............. H01L 29/6659
257/E21.285
(Continued)

FOREIGN PATENT DOCUMENTS

CN 207217538 U * 4/2018 ....... H01L 27/14603
CN 211378129 U * 8/2020 ............. H04N 5/335

*Primary Examiner* — Yuzhen Shen
(74) *Attorney, Agent, or Firm* — Christensen O'Connor Johnson Kindness PLLC

(57) ABSTRACT

Provided are an ultrasonic fingerprint identification circuit, a driving method thereof, and a display device. The ultrasonic fingerprint identification circuit comprises fingerprint identification units each including an ultrasonic fingerprint identification sensor connected to a first node; a control module connected to a composite signal line, a first control signal line and the first node and configured to provide a reset potential to the first node and to provide a pull-up potential to the first node in response to a first level provided by the composite signal line; a reading module connected to a second control signal line, the first node and a reading signal line, and configured to read a detection signal of the first node. The first control signal line connected to one fingerprint identification unit is reused as the second control signal line connected to another fingerprint identification unit.

21 Claims, 18 Drawing Sheets

(51) Int. Cl.
*G01S 15/89* (2006.01)
*G06V 10/98* (2022.01)
*H01L 29/786* (2006.01)

(52) U.S. Cl.
CPC .......... *G06V 10/98* (2022.01); *H01L 29/7869* (2013.01); *H01L 29/78666* (2013.01); *H01L 29/78675* (2013.01); *H01L 29/78696* (2013.01)

(56) References Cited

U.S. PATENT DOCUMENTS

| | | | |
|---|---|---|---|
| 9,367,164 B2* | 6/2016 | Wu | G06F 3/041 |
| 10,004,432 B2* | 6/2018 | Mathe | G01S 15/8906 |
| 2005/0243037 A1* | 11/2005 | Eom | G09G 3/3233 |
| | | | 345/76 |
| 2007/0070564 A1* | 3/2007 | Ma | H03F 1/52 |
| | | | 361/56 |
| 2018/0130424 A1* | 5/2018 | Gao | G09G 3/3291 |
| 2020/0035179 A1* | 1/2020 | Chen | G09G 3/3648 |
| 2020/0348818 A1* | 11/2020 | Ding | G06F 3/0412 |
| 2020/0356743 A1* | 11/2020 | Li | G06V 40/13 |

* cited by examiner

ULTRASONIC FINGERPRINT IDENTIFICATION CIRCUIT, DRIVING METHOD THEREOF, AND DISPLAY DEVICE

CROSS-REFERENCE TO RELATED APPLICATIONS

The present application claims priority to Chinese Patent Application No. 202010558026.3, filed on Jun. 18, 2020, the content of which is incorporated herein by reference in its entirety.

TECHNICAL FIELD

The present disclosure relates to the field of display technology, and particularly, to an ultrasonic fingerprint identification circuit, a driving method thereof, and a display device.

BACKGROUND

In recent years, with the rapid development of technology, display devices with biometric functions have gradually emerged in our lives and work, and the fingerprint identification technology is widely used in the areas such as unlocking and secure payment by virtue of unique identities of fingerprints. In addition, for an ultrasonic fingerprint identification technology, due to strong penetration of ultrasonic waves, the fingerprints can still be identified even when there are water stains or dirty stains on a surface of the finger, and the technology attracts a lot of attention.

However, regarding the existing designs of the ultrasonic fingerprint identification circuit, a large number of wirings are arranged in the circuit, and the reading of signal will be interfered by coupling capacitance generated between the wirings during a transmission process, thereby resulting in poor identification precision.

SUMMARY

In view of this, embodiments of the present disclosure provide an ultrasonic fingerprint identification circuit, a driving method thereof, and a display device, which improve the precision of fingerprint identification.

In a first aspect, the present disclosure provides an ultrasonic fingerprint identification circuit, comprising a plurality of fingerprint identification units, each of the plurality of fingerprint identification units comprising: an ultrasonic fingerprint identification sensor electrically connected to a first node, wherein the ultrasonic fingerprint identification sensor is configured to: convert a first electrical signal to an ultrasonic signal and radiate the ultrasonic signal towards a finger, and convert an ultrasonic signal reflected by the finger to a second electrical signal and transmit the second electrical signal to the first node; a control module electrically connected to a composite signal line, the first node, and one first control signal line of a plurality of first control signal lines, wherein the control module is configured to: provide a reset potential to the first node in response to a first level provided by the one of the plurality of first control signal lines, and provide a pull-up potential to the first node in response to a first level provided by the composite signal line; and a reading module electrically connected to the first node, a reading signal line, and one second control signal line of a plurality of second control signal lines, wherein the reading module is configured to read a detection signal of the first node in response to a first level provided by the one second control signal line, wherein one of the plurality of first control signal lines electrically connected to one of the plurality of fingerprint identification units is reused as one of the plurality of second control signal lines electrically connected to another one of the plurality of fingerprint identification units.

In a second aspect, the present disclosure provides a driving method of an ultrasonic fingerprint identification circuit, the driving method being used to drive the ultrasonic fingerprint identification circuit according to claim 1, a driving cycle of each of the plurality of fingerprint identification units of the ultrasonic fingerprint identification circuit comprising a preparation period, a pull-up period, and a reading period. The driving method comprises: in the preparation period, converting, by the ultrasonic fingerprint identification sensor, the first electrical signal to the ultrasonic signal and radiating the ultrasonic signal towards the finger, providing, by the one first control signal line of a plurality of first control signal lines, the first level, and transmitting, by the control module, the second level provided by the composite signal line to the first node; in the pull-up period, converting, by the ultrasonic fingerprint identification sensor, the ultrasonic signal reflected by the finger to the second electrical signal and transmitting the second electrical signal to the first node, providing, by the composite signal line, the first level, and transmitting, by the control module, the first level provided by the composite signal line to the first node, to pull up the potential of the first node; and in the reading period, providing, by one of the plurality of second control signal lines, the first level, and reading, by the reading module, the detection signal of the first node.

In a third aspect, the present disclosure provides a display device, including: a display panel having a display area, wherein the display area comprises a main display area and a fingerprint identification area; the ultrasonic fingerprint identification circuit according to the first aspect, wherein the ultrasonic fingerprint identification circuit is disposed in the fingerprint identification area; and a processor electrically connected to the reading signal line and configured to identify fingerprints based on a signal read by the reading signal line.

BRIEF DESCRIPTION OF DRAWINGS

In order to explain technical solutions of embodiments of the present disclosure, accompanying drawings used in the embodiments are briefly described below. The drawings described below merely illustrate some of the embodiments of the present disclosure. Based on these drawings, those skilled in the art can obtain other drawings.

DESCRIPTION OF EMBODIMENTS

In order to explain technical solutions of the present disclosure, the embodiments of the present disclosure are described in detail with reference to the drawings.

It should be understood that the described embodiments are merely some of the embodiments of the present disclosure rather than all of the embodiments. All other embodiments obtained by those skilled in the art shall fall into the protection scope of the present disclosure.

The terms used in the embodiments of the present disclosure are merely for the purpose of describing particular embodiments, but not intended to limit the present disclosure. Unless otherwise noted in the context, the singular form expressions "a", "an", "the" and "said" used in the embodiments and appended claims of the present disclosure also represent a plural form.

It should be understood that the term "and/or" describes three relations of the associated objects. For example, A and/or B may indicate three cases: only A exists; A and B exist concurrently; only B exists. In addition, a character "/" herein generally indicates that the associated objects are in an "or" relationship.

Figure 1:
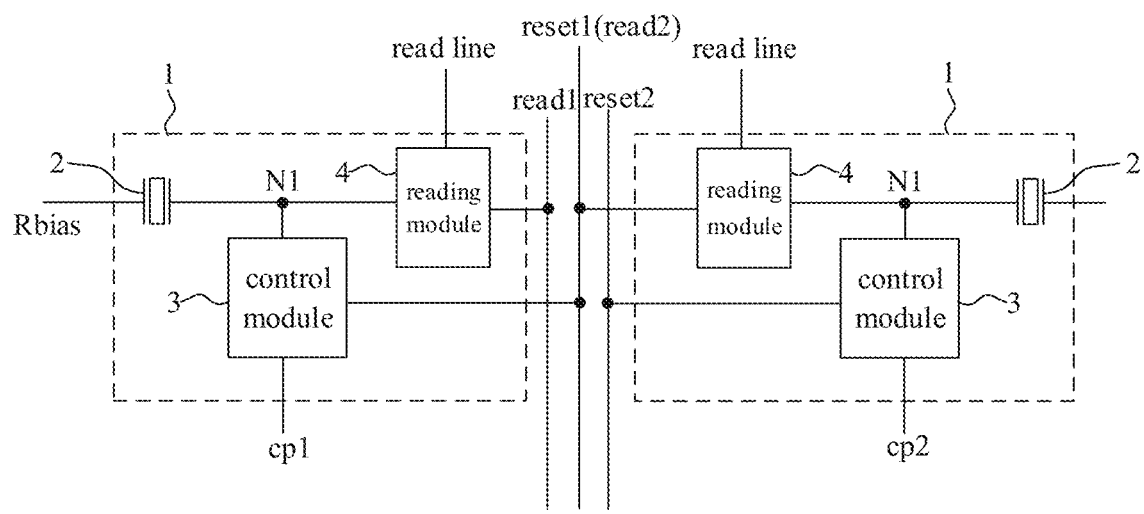
FIG. 1 is a structural schematic diagram of a fingerprint identification circuit provided by an embodiment of the present disclosure.

FIG. 1 is a structural schematic diagram of a fingerprint identification circuit provided by an embodiment of the present disclosure. As shown in FIG. 1, the ultrasonic fingerprint identification circuit includes a plurality of fingerprint identification units 1. Each of the fingerprint identification units 1 includes an ultrasonic fingerprint identification sensor 2, a control module 3 and a reading module 4. The ultrasonic fingerprint identification sensor 2 is electrically connected to a first node N1 to convert an electrical signal into an ultrasonic signal, radiate the ultrasonic signal towards a finger, convert the ultrasonic signal reflected by the finger into an electrical signal, and transmit the electrical signal to the first node N1. The control module 3 is electrically connected to a composite signal line cp, a first control signal line reset and the first node N1, to provide a reset potential to the first node N1 in response to a first level provided by the first control signal line reset, and provide a pull-up potential to the first node N1 in response to a first level provided by the composite signal line cp. The reading module 4 is electrically connected to a second control signal line read, the first node N1 and a reading signal line read line, to read a detection signal of the first node N1 in response to a first level provided by the second control signal line read.

The first control signal line reset electrically connected to one of the fingerprint identification units 1 is reused as the second control signal line read electrically connected to another one of the fingerprint identification units 1. For the purpose of distinction, in FIG. 1, read1, reset1, and cp1 respectively denote the first control signal line reset, the second control signal line read, and the composite signal line cp corresponding to one of the fingerprint identification units 1, and read2, reset2, and cp2 respectively denote the first control signal line reset, the second control signal line read, and the composite signal line cp corresponding to another one of the fingerprint identification units 1.

It should be noted that the above first level and second level correspond to high and low levels. If the first level is a high level, the second level is a low level; and if the first level is a low level, the second level is a high level. In the embodiments of the present disclosure, for example, the first level is a high level and the second level is a low level.

For example, a driving cycle of one frame of the fingerprint identification unit 1 includes a preparation period, a pull-up period, and a reading period. In the preparation period, the ultrasonic fingerprint identification sensor 2 converts the electrical signal for fingerprint identification into the ultrasonic signal, and radiates the ultrasonic signal towards the finger, and the control module 3 provides the reset potential to the first node N1 to maintain the stable potential of the first node N1. In the pull-up period, the ultrasonic fingerprint identification sensor 2 converts the ultrasonic signal reflected by the finger into the electrical signal and transmits the electrical signal to the first node N1, and the control module 3 provides the pull-up potential to the first node N1, to pull up the potential of the first node N1. In the reading period, the reading module 4 reads the detection signal of the first node N1.

Further, the detection signal of the first node N1 may include an initial voltage and a detection voltage, and correspondingly, the reading period may include an initial voltage reading period and a detection voltage reading period. The initial voltage reading period is prior to the preparation period, and the detection voltage reading period is latter than the pull-up period.

Figure 2:
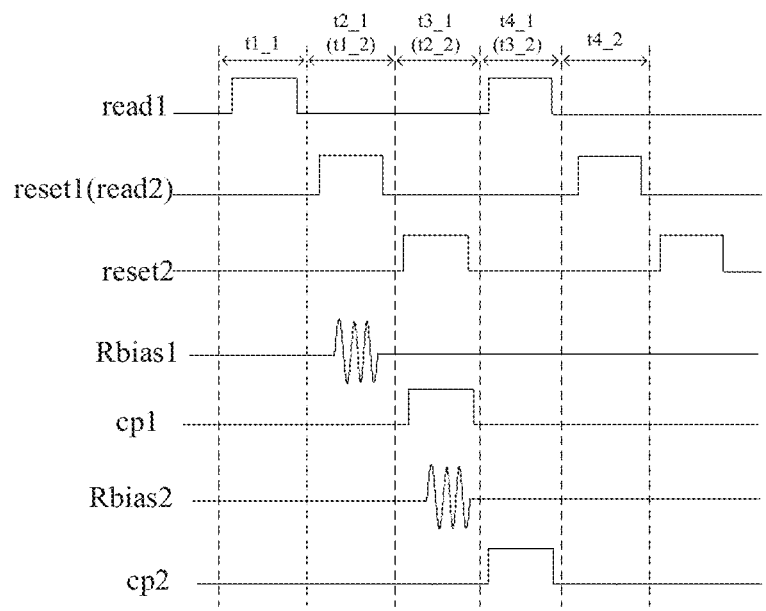
FIG. 2 is a timing diagram corresponding to a circuit structure shown in FIG. 1.

As an example, the reading period includes the initial voltage reading period and the detection voltage reading period, in order to explain a driving principle of the fingerprint identification unit in combination with FIG. 2. FIG. 2 is a timing diagram corresponding to a circuit structure shown in FIG. 1.

The driving cycle of one frame of the fingerprint identification unit 1 includes an initial voltage reading period t1, a preparation period t2, a pull-up period t3, and a detection voltage reading period t4. In order to facilitate understanding, respective periods corresponding to the first fingerprint identification unit 1 (i.e., the fingerprint identification unit labeled with the read1, the reset1, and the cp1) shown in FIG. 1 are represented by t1_1 to t4_1 in FIG. 2; and respective periods corresponding to the second fingerprint identification unit 1 (i.e., the fingerprint identification unit labeled with the read2, the reset2, and the cp2) shown in FIG. 1 are represented by t1_2 to t4_2 in FIG. 2.

In the initial voltage reading period t1, the second control signal line read provides a first level, and the reading module 4 reads an initial voltage V1 at the first node N1.

In the preparation period t2, a detection signal line Rbias outputs an electrical signal (such as a Rbias signal shown in FIG. 2) for fingerprint identification to the ultrasonic fingerprint identification sensor 2, the ultrasonic fingerprint identification sensor 2 converts the electrical signal into the ultrasonic signal and radiates it towards the finger, the first control signal line reset provides a first level, the control module 3 transmits a second level, which is provided by the composite signal line cp, to the first node N1, i.e., to provide a reset potential to the first node N1. In this way, the first node N1 is maintained at a stable low potential, preventing the potential of the first node N1 from being interfered by the ultrasonic signal converted by the ultrasonic fingerprint identification sensor 2.

In the pull-up period t3, the ultrasonic fingerprint identification sensor 2 converts the ultrasonic signal reflected by the finger into an electrical signal and transmits it to the first node N1. The electrical signal converted by the ultrasonic signal is a signal fluctuating between the high and low potentials, and thus the composite signal line cp provides a first level, the control module 3 transmits the first level provided by the composite signal line cp to the first node N1, i.e., to provide a pull-up potential to the first node N1. In this way, the pull-up potential and the low potential of the electric signal are superimposed to pull up the potential of the first node N1, and to perform wave-chopping on the electric signal converted by the ultrasonic signal.

It should be noted that the electrical signal converted from the ultrasonic signal is a signal fluctuating between the high and low potentials, and the highest potential of the electrical signal is used for subsequent detection and identification. Therefore, the pull-up potential only pulls up the low potential of the electrical signal to a reasonable extent and does not cover the original highest potential of the electrical signal.

In the detection voltage reading period t4, the second control signal line read provides a first level, and the reading module 4 reads the detection voltage V2 at the first node N1.

Furthermore, a processor can identify valleys and ridges of the fingerprint by reading V1 and V2 in a time division manner and by determining a difference between V1 and V2.

Based on the above driving principle, in the embodiment of the present disclosure, it is assumed that the ultrasonic fingerprint identification circuit includes n fingerprint identification units 1, if the first control signal line reset electrically connected to one of the n fingerprint identification units 1 is reused as the second control signal line read electrically connected to another one of the n fingerprint identification units 1, as long as all of the n fingerprint identification units 1 can work normally, the number of the first control signal lines reset and the second control signal lines read that are initially required to be provided can be reduced from 2n to n+1, thereby greatly reducing the number of required control signal lines. On the one hand, the space occupied by the control signal lines can be reduced and saved for the design space of the ultrasonic fingerprint identification circuit. On the other hand, coupling between the control signal lines, and coupling between the control signal lines and other wirings can be reduced to lower interference of coupling capacitance on the read signal and to improve accuracy of the read signal, thereby improving accuracy of fingerprint identification.

In addition, it can be understood that, when reading the voltage at the first node N1, there will inevitably be a noise signal in the read signal. However, in the embodiment of the present disclosure, since the reading period includes the initial voltage reading period t1 and the detection voltage reading period t4, in the driving cycle of one frame, the voltage at the first node N1 can be read twice in a time division manner respectively at the initial voltage reading period t1 and the detection voltage reading period t4. Further, the valleys and ridges of the fingerprint are identified based on a difference between the two voltages. Therefore, even if the read signal contains the noise signal, the noise signal can be eliminated by subtracting the two voltages, which reduces the influence of the noise signal on the detection accuracy and effectively enhances a signal-to-noise ratio, thereby further improving the accuracy of the fingerprint identification.

Figure 3:
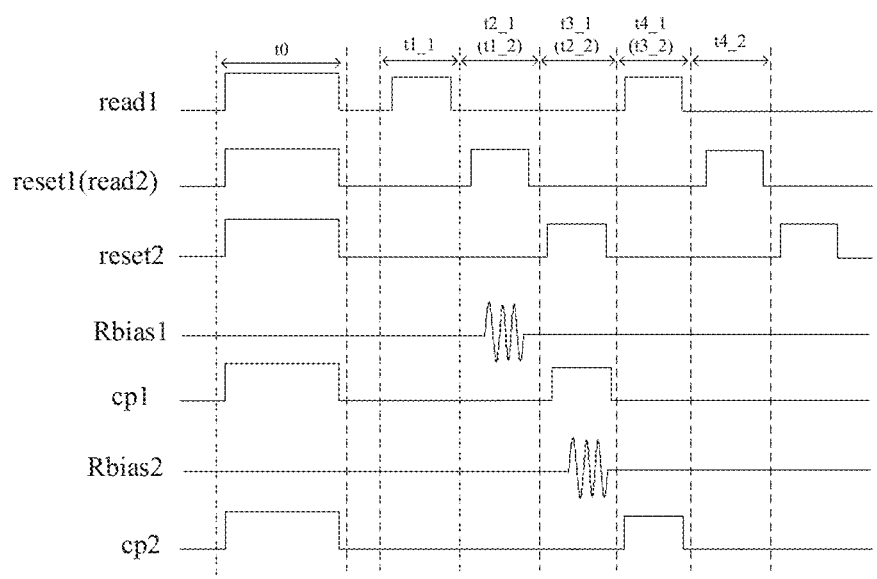
FIG. 3 is another timing diagram corresponding to the circuit structure shown in FIG. 1.

Further, based on the above structure, applicant has found through research that when the initial voltage at the first node N1 is read in the initial voltage reading period t1, the initial voltage at the first node N1 of different fingerprint identification units 1 may be different; the slight difference between the fingerprint valley and the fingerprint ridge is likely to be covered by the difference of the initial signal if the respective initial voltages are read directly to subsequently perform differencing based on the initial voltage and the detection voltage, thereby causing inaccuracy of the identification. In view of this, in the embodiment of the present disclosure, as shown in FIG. 3, which is another timing diagram corresponding to the circuit structure shown in FIG. 1, the driving cycle further includes an overall resetting period t0 prior to the initial voltage reading period t1. In the overall resetting period t0, the first control signal line reset, the second control signal line read, and the composite signal line cp respectively provide the first level, the control module 3 transmits the first level provided by the composite signal line cp to the first node N1, to perform overall resetting on the first node N1. In this way, before the beginning of the driving cycle of each frame, the voltages of the first nodes N1 in the respective fingerprint identification units 1 are uniformly reset to a high potential, so as to allow the respective fingerprint identification units 1 to read uniform magnitudes of the initial voltages, thereby preventing the difference in initial voltage from affecting the accuracy of the identification.

Figure 4:
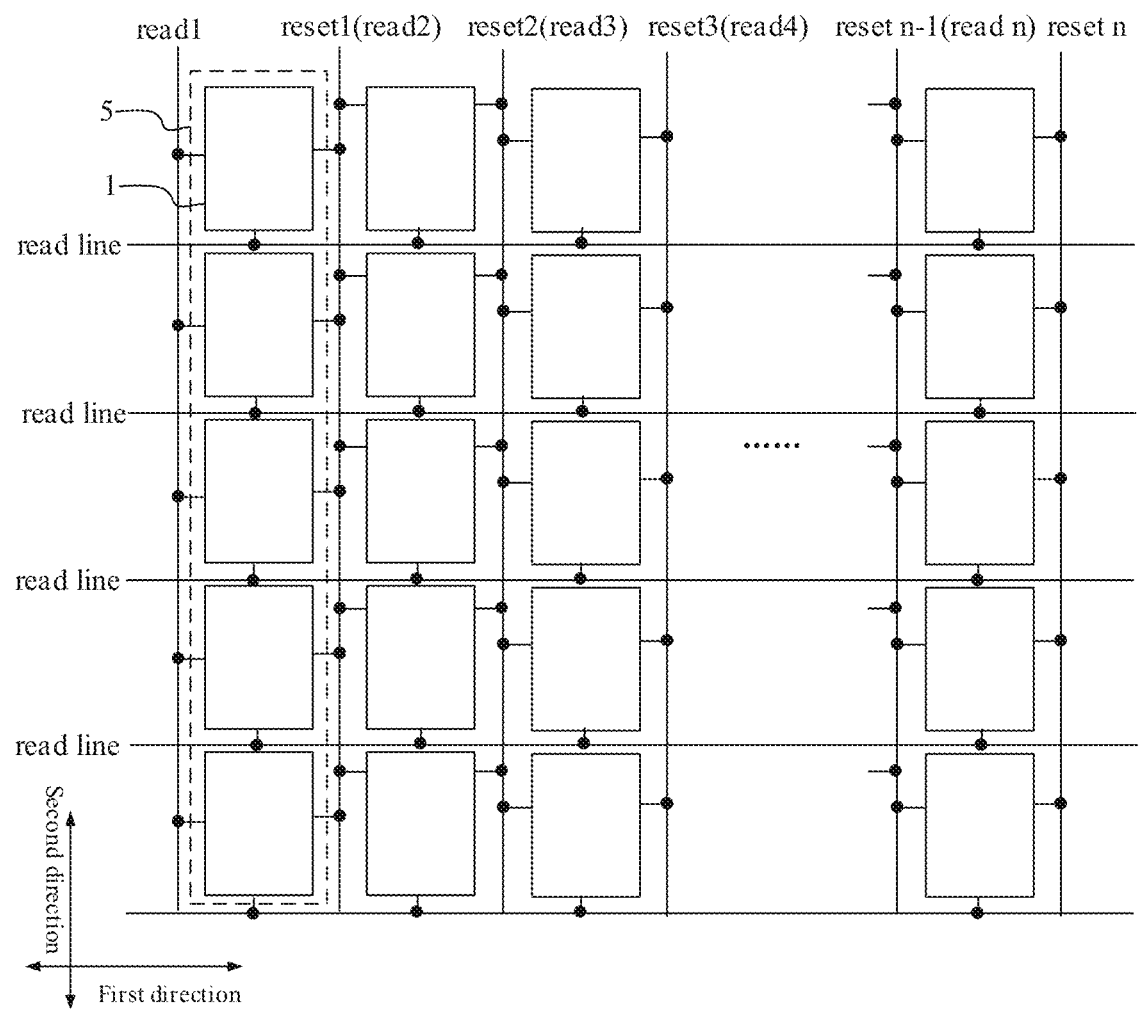
FIG. 4 is a structural schematic diagram of an ultrasonic fingerprint identification circuit provided by another embodiment of the present disclosure.

FIG. 4 is another structural schematic diagram of the ultrasonic fingerprint identification circuit provided by an embodiment of the present disclosure. In the embodiment as shown in FIG. 4, a plurality of fingerprint identification unit groups 5 is arranged along a first direction, each fingerprint identification unit group 5 includes multiple fingerprint identification units 1 arranged along a second direction, and the first direction intersects the second direction. The fingerprint identification units 1 in the same fingerprint identification unit group 5 are electrically connected to the same first control signal line reset and the same second control signal line read. Moreover, for any two adjacent fingerprint identification unit groups 5, the first control signal line reset corresponding to one fingerprint identification unit group 5 is reused as the second control signal line read corresponding to the other one fingerprint identification unit group 5.

Compared with the example in which each fingerprint identification unit 1 is provided with one first control signal line reset and one second control signal line read correspondingly, in the above structure, the fingerprint identification units 1 located in the same fingerprint identification unit group 5 are correspondingly provided with one first control signal line reset and one second control signal line read, and further, by reusing the first control signal line reset corresponding to one fingerprint identification unit group 5 to the second control signal line read corresponding to the adjacent fingerprint identification unit group 5, the number of the control signal lines required to be provided for all the fingerprint identification units 1 can be greatly reduced. In this way, the space occupied by the control signal lines is further reduced, and the interference of the coupling capacitance generated by the control signal lines on the read signal is further reduced.

Figure 5:
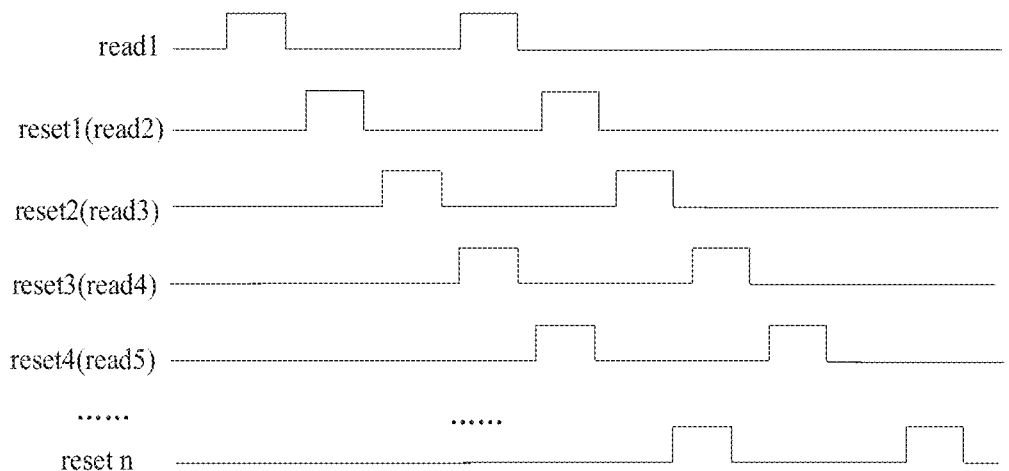
FIG. 5 is a timing diagram corresponding to a circuit structure shown in FIG. 4.
Figure 6:
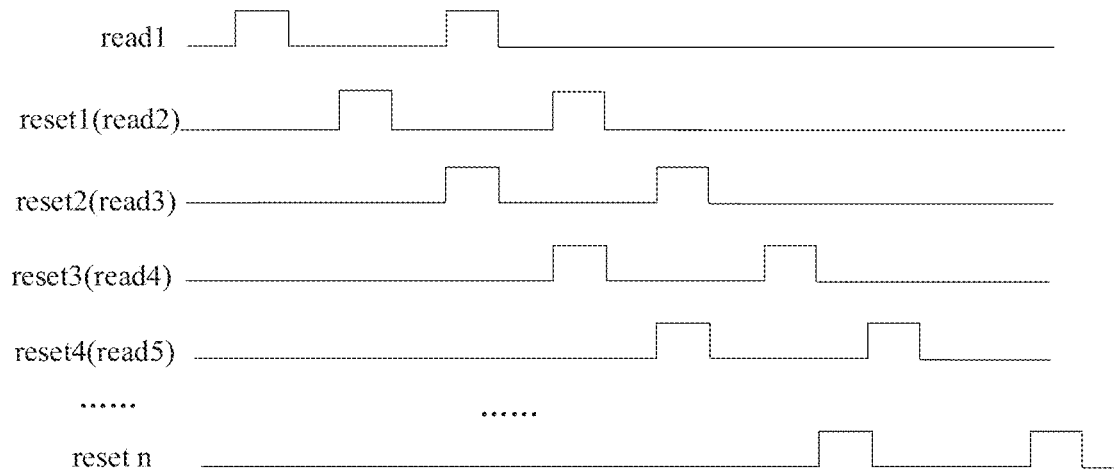
FIG. 6 is another timing diagram corresponding to the circuit structure shown in FIG. 4.

It should be noted that according to a different output frequencies of the first control signal and the second control signal, for example, when the output frequencies of the first control signal and the second control signal are relatively high, a timing diagram corresponding to the circuit structure shown in FIG. 4 is illustrated in FIG. 5. In this case, the second high level of the read1 signal is flush with the first high level in the read4 signal. For example, when the output frequencies of the first control signal and the second control signal are relatively low, another timing diagram corresponding to the circuit structure shown in FIG. 4 is illustrated in FIG. 6. In this case, the second high level in the read1 signal is flush with the first high level in the read3 signal. The output frequencies of the first control signal and the second control signal can be set according to actual requirements, which are not specifically limited in the embodiments of the present disclosure.

Further referring to FIG. 4, the first control signal line reset and the second control signal line read are alternately arranged in a gap between two adjacent fingerprint identification unit groups 5. Only one of the first control signal line reset and the second control signal line read is provided in the gap between any two adjacent fingerprint identification unit groups 5. In addition, the first control signal line reset corresponding to the i-th fingerprint identification unit group 5 is provided in a gap between the i-th fingerprint identification unit group 5 and the (i+1)-th fingerprint identification unit group 5. With such configuration, when the first control signal line reset corresponding to the i-th fingerprint identification unit group 5 is reused as the second control signal line read of the (i+1)-th fingerprint identification unit group 5, the first control signal line reset corresponding to the i-th fingerprint identification unit group 5 is provided in the gap, the first control signal line reset can be electrically connected to the fingerprint identification units 1 in the i-th and (i+1)-th fingerprint identification unit groups 5 more conveniently, which reduces complexity of the wirings.

Figure 7:
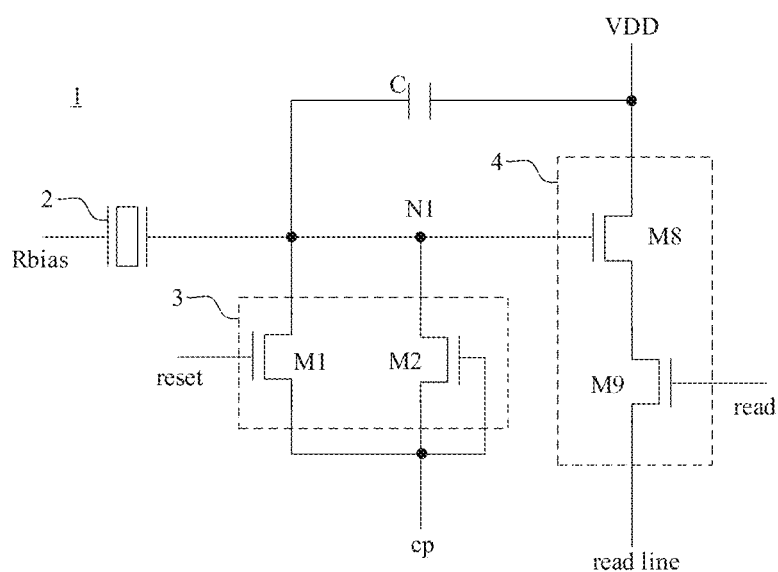
FIG. 7 is a schematic diagram of a circuit structure of a fingerprint identification unit provided by an embodiment of the present disclosure.
Figure 8:
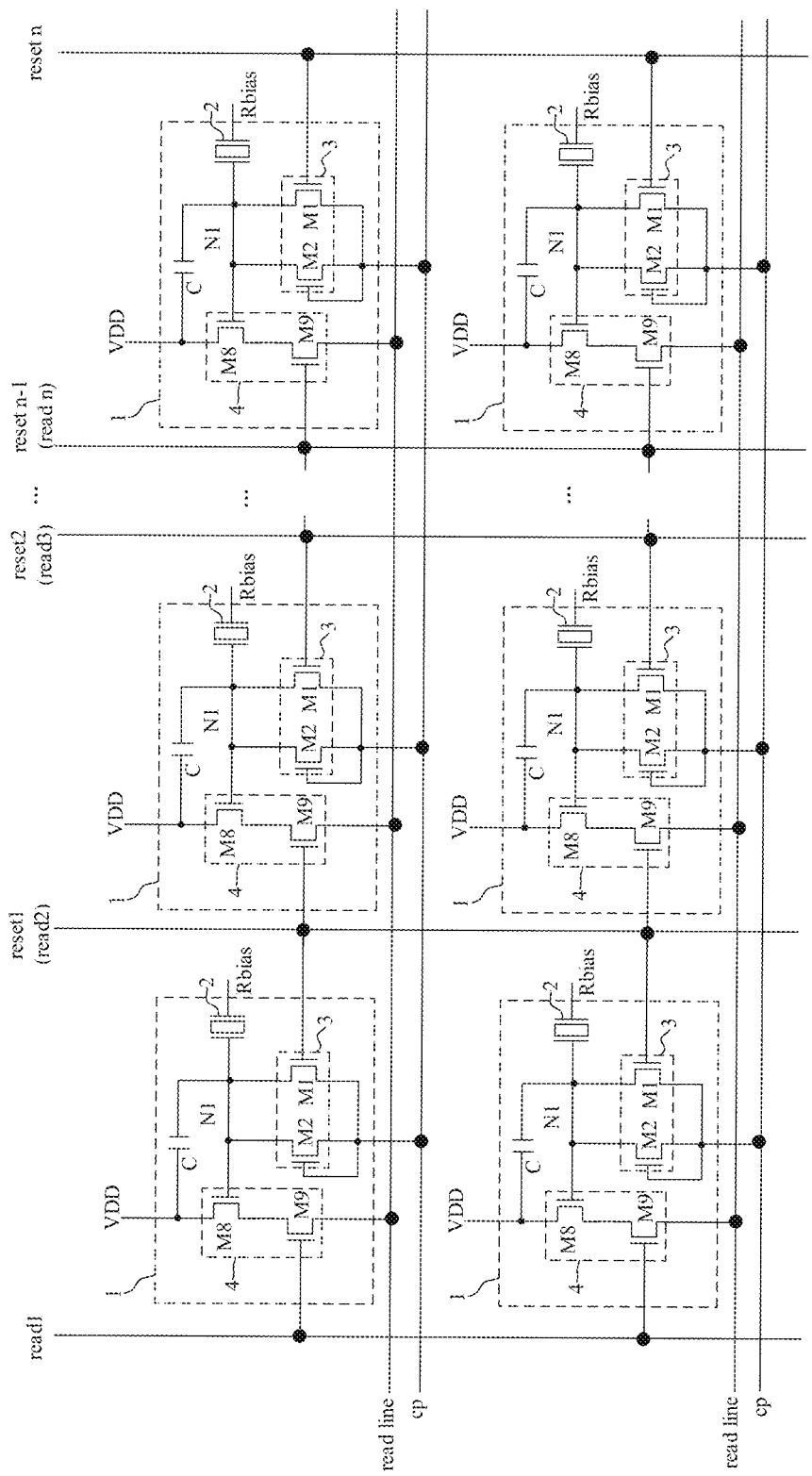
FIG. 8 is a structural schematic diagram of an ultrasonic fingerprint identification circuit corresponding to the fingerprint identification unit shown in FIG. 7.

FIG. 7 is a schematic diagram of a circuit structure of a fingerprint identification unit provided by an embodiment of the present disclosure, and FIG. 8 is a structural schematic diagram of an ultrasonic fingerprint identification circuit corresponding to the fingerprint identification unit shown in FIG. 7. In the embodiment as shown in FIG. 7 and FIG. 8, the control module 3 includes a first transistor M1 and a second transistor M2. A gate of the first transistor M1 is electrically connected to the first control signal line reset, a first terminal of the first transistor M1 is electrically connected to the first node N1, and a second terminal of the first transistor M1 is electrically connected to the composite signal line cp. A gate and a second terminal of the second transistor M2 are electrically connected to the composite signal line cp, and a first terminal of the second transistor M2 is electrically connected to the first node N1.

For example, in combination with the timing shown in FIG. 3, in the overall resetting period t0, the first control signal line reset, the second control signal line read, and the composite signal line cp each provides the first level, the first transistor M1 is conducted under the first level provided by the first control signal line reset, the second transistor M2 is conducted under an action of the first level provided by the composite signal line cp, the first level provided by the composite signal line cp is transmitted to the first node N1 via the conducted first transistor M1 and the second transistor M2, to perform the overall resetting on the first node N1, so that the magnitudes of the initial voltages corresponding to the respective fingerprint identification units 1 are uniform, and the difference in the initial voltage is prevented from affecting the identification accuracy.

With reference to the timing shown in FIG. 3, in the preparation period t2, the first control signal line reset provides the first level, the second control signal line read and the composite signal line cp provide the second level, the first transistor M1 is conducted under the first level provided by the first control signal line reset, and the second level provided by the composite signal line cp is transmitted to the first node N1 through the conducted first transistor M1, so that the first node N1 is maintained at a stable low potential and thus is not interfered by ultrasonic signals.

In combination with the timing shown in FIG. 3, in the pull-up period t3, the first control signal line reset and the second control signal line read provide the second level, the composite signal line cp provides the first level, the second transistor M2 is conducted under the first level provided by the composite signal line cp, and the gate and the second terminal of the second transistor M2 are electrically connected to each other, so that the second transistor M2 has unidirectional conductivity, the first level provided by the composite signal line cp is transmitted to the first node N1 via the conducted second transistor M2, and the high potential of the first level is used to pull up the potential of the first node N1.

In addition, it should be noted that in one solution in the research, a diode is adopted to pull up the potential of the first node N1. That is, an anode of the diode is electrically connected to the first node N1, and a cathode of the diode is electrically connected to the composite signal line cp. However, since a leakage current of the diode is relatively great when the diode is turned off, when reading the voltage of the first node N1, the leakage current of the diode may cause loss of charges of the first node N1 and may affect the stability of the potential of the first node N1. For example, for the ultrasonic fingerprint identification circuit that includes a large number of the fingerprint identification units 1, distances between the processor and some of the fingerprint identification units 1 are relatively large, and thus, when the signal read by these fingerprint identification units 1 is transmitted to the processor, a transmission path is relatively long, which may result in a significant signal attenuation. In addition to the influence of the leakage current on the potential of the first node N1, the signal of these fingerprint identification units 1 may be unreadable in severe cases, thereby affecting the identification.

In view of the above, applicant has found through research that, when the gate and the first terminal of the transistor are electrically connected to each other, or when the gate and the second terminal of the transistor are electrically connected to each other (the transistor having the electrically connected gate and the first terminals or the transistor having the electrically connected gate and the second electrodes are referred to as the transistors TFT-D hereinafter), the leakage current of the transistor TFT-D that is turned off is very small, and can be 2 to 3 orders of magnitude smaller than the leakage current of the diode that is turned off, with reference to Table 1.

TABLE 1

| NTFT (W3L3) | NTFT (W4L3) | NTFT (W8L3) | NTFT (W4.5L4) | NTFT (W5.5L4) | NTFT (W2.5L3) | PTFT (W6L4.2) |
|---|---|---|---|---|---|---|
| $I_{off}$ 3.45E-12 | 4.42E-12 | 5.50E-12 | 3.85E-12 | 4.53E-12 | 2.50E-12 | 5.01-12 |

Figure 9:
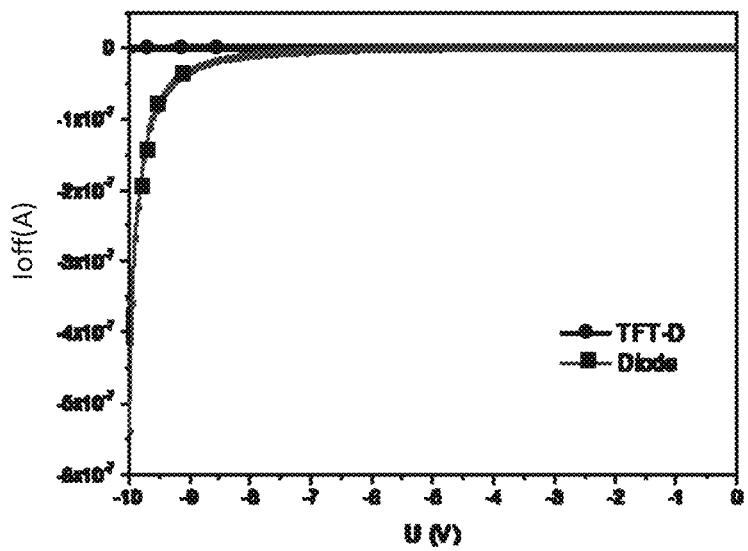
FIG. 9 is a graph of leakage currents of a diode and a transistor TFT-D provided by an embodiment of the present disclosure.
Figure 10:
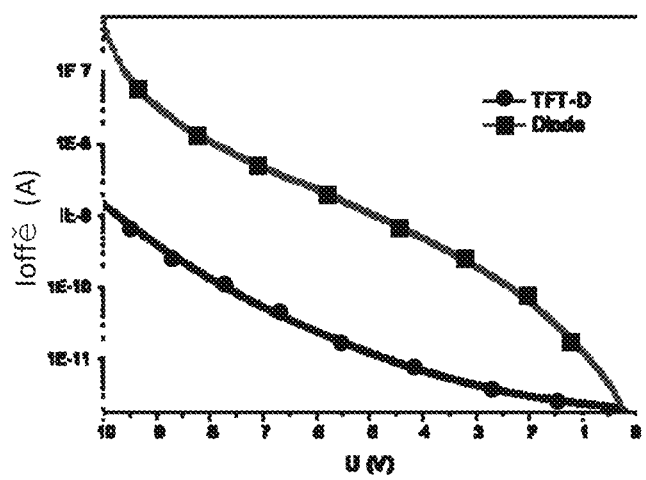
FIG. 10 is another graph of leakage current of a diode and a transistor TFT-D provided by an embodiment of the present disclosure.

FIG. 9 is a graph of leakage currents of a diode and a transistor TFT-D provided by an embodiment of the present disclosure, and FIG. 10 is another graph of leakage current of a diode and a transistor TFT-D provided by an embodiment of the present disclosure. As shown in FIG. 9 and FIG. 10, Ioff of the ordinate in FIG. 9 is the leakage current, and the ordinate in FIG. 10 indicates Ioff'=lg|Ioff|, when the diode has a width of 6 μm and a length of 3 μm, under a reverse bias voltage of −5V, the leakage current of the diode is −1.06E-09A. Referring to FIG. 10, when the transistor TFT-D also has a width of 6 μm and a length of 3 μm, the Ioff' corresponding to the transistor TFT-D is much smaller than the Ioff of the diode, and correspondingly, the leakage current of the transistor TFT-D in the turn-off state is much smaller than the leakage current of the diode in the turn-off state.

In view of the above, in an embodiment of the present disclosure, as the gate and the second terminal of the second transistor M2 are electrically connected to each other, the second transistor M2 can be in a unidirectional conduction state when it is conducted, and in the detection voltage reading period t4, when the second transistor M2 is turned off under the second level provided by the composite signal line cp, the leakage current of the second transistor M2 in the turn-off state is very small, and thus the loss of the charges of the first node N1 is also very small. In this way, the influence of the leakage current on the potential of the first node N1 is reduced, and the potential at the first node N1 is more stable, thereby improving the accuracy of the reading of the voltage at the first node N1.

In an embodiment, the first transistor M1 is a low-temperature polysilicon transistor. When the first transistor M1 is set to be the low-temperature polysilicon transistor, the first transistor M1 has a relatively fast response speed, the resetting of the first node N1 in the overall resetting period t0 can be performed faster, and thus the resetting of the first node N1 is more complete.

In an embodiment, the second transistor M2 is a low-temperature polycrystalline oxide transistor or an amorphous silicon transistor. Compared with silicon-based transistors, the low-temperature polycrystalline oxide transistor has no p-channel inverse state, and thus the second transistor M2 can have a relatively low leakage current in the turn-off state when the second transistor M2 is set to be the low-temperature polycrystalline oxide transistor. The amorphous silicon transistor, due to a low mobility of the amorphous silicon, has very low conductivity, and thus the second transistor M2 can also have a relatively low leakage current when in the turn-off state when the second transistor M2 is the amorphous silicon transistor.

Figure 11:
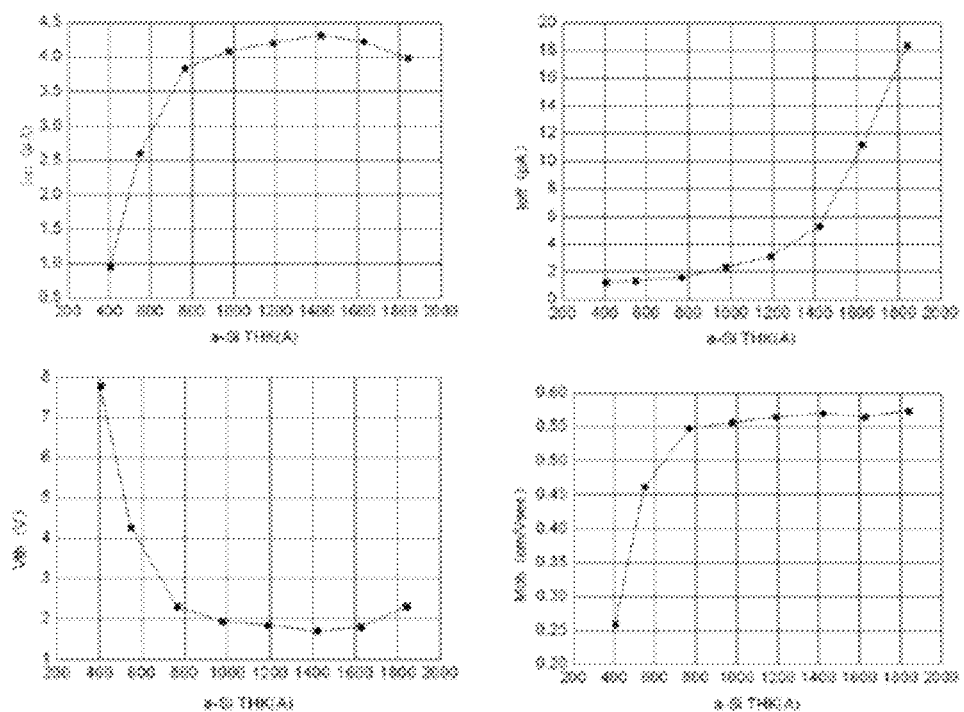
FIG. 11 illustrates graphs of relation of a thickness of an amorphous silicon layer with an operating current, a leakage current, a conduction voltage and electron mobility.

Further, when the second transistor M2 is the amorphous silicon transistor, the leakage current of the second transistor M2 is positively correlated with the film thickness of the amorphous silicon layer, i.e., positively correlated with the film thickness of an active layer, according to an equation:

$$Ioff = \frac{W}{L}q\sqrt{\frac{k}{r}}T^{\frac{3}{2}}e^{-\varepsilon/2kT}(\mu e + \mu p)V_d d,$$

where w is a width of the channel, L is a length of the channel, q is electron charge, k is the Boltzmann constant, k/r is charge density, $V_d$ is a source-drain voltage of the transistor, d is a film thickness of an amorphous silicon layer, ε is an optical band gap, t is a temperature, and μe and μp are the mobility of electrons and holes respectively. FIG. 11 illustrates graphs of relationship of the thickness of the amorphous silicon layer with an operating current, the leakage current, a conduction voltage and electron mobility, when the thickness of the active layer of the second transistor M2 is L1, L1 is set to satisfy: 200 Å≤L1≤1000 Å, in order to ensure that the second transistor M2 has a relatively low leakage current.

In an embodiment, in order to ensure that the second transistor M2 has a relatively low leakage current and that the first transistor M1 has a relatively high response speed, a width-to-length ratio of the second transistor M2 is smaller than a width-to-length ratio of the first transistor M1.

Figure 12:
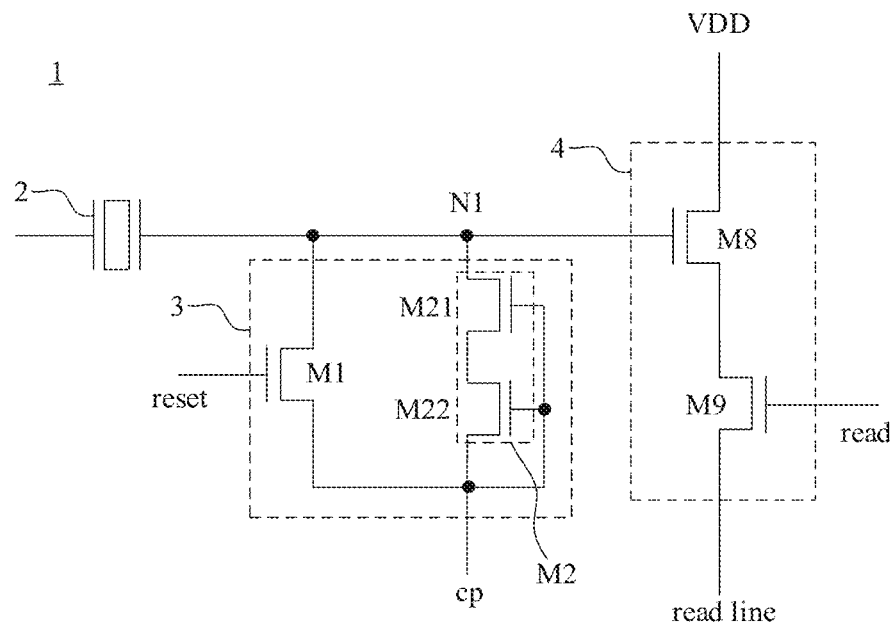
FIG. 12 is a structural schematic diagram of a second transistor provided by an embodiment of the present disclosure.

FIG. 12 is a structural schematic diagram of a second transistor provided by an embodiment of the present disclosure. In the embodiment shown in FIG. 12, the second transistor M2 includes a first sub-transistor M21 and a second sub-transistor M22 arranged in series, gates of the first sub-transistor M21 and the second sub-transistor M22 are electrically connected to each other, a second terminal of the second sub-transistor M22 is electrically connected to a first terminal of the first sub-transistor M21, a first terminal of the second sub-transistor M22 is electrically connected to the gate of the second sub-transistor M22 and the composite signal line cp, and a second terminal of the first sub-transistor M21 is electrically connected to the first node N1. As the second transistor M2 includes two sub-transistors connected in series, the second transistor M2 in the layout has an increased length, which reduces the width-to-length ratio of the second transistor M2 and thus reduces the leakage current of the second transistor M2 in the turn-off state.

Figure 13:
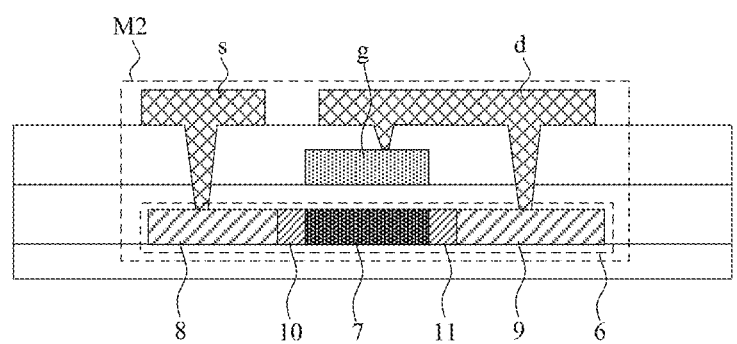
FIG. 13 is a structural schematic diagram of a film layer of a second transistor provided by an embodiment of the present disclosure.

In a manufacturing process of an existing transistor, doped regions of the active layer of the transistor are all formed by high-concentration process doping, and thus relatively large leakage current may exist between the first terminal and the second terminal of the transistor. FIG. 13 is a structural schematic diagram of a film layer of the second transistor provided by an embodiment of the present disclosure. In the embodiment of the present disclosure shown in FIG. 13, the second transistor M2 includes an active layer 6, the active layer 6 includes a channel region 7, a first heavily doped region 8 and a second heavily doped region 9; a first terminal s of the second transistor M2 is electrically connected to the first heavily doped region 8, and a second terminal d of the second transistor M2 is electrically connected to the second heavily doped region 9 and a gate g; a first lightly doped region 10 is provided between the first heavily doped region 8 and the channel region 7, a second lightly doped region 11 is provided between the second heavily doped region 9 and the channel region 7. The lightly doped regions are provided to balance a doping concentration of the doped region, so as to reduce the leakage current generated between the first terminal and the second terminal and reduce the leakage current of the second transistor M2.

Figure 14:
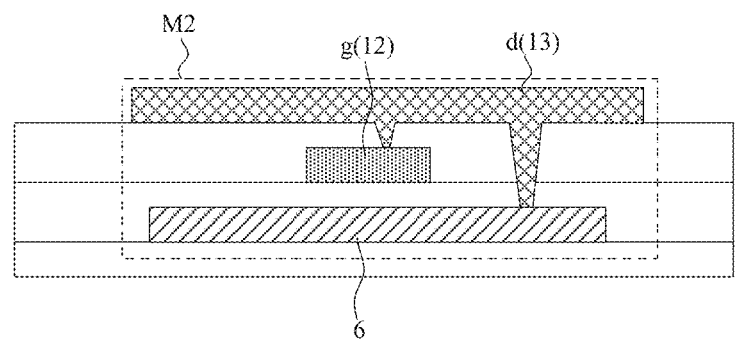
FIG. 14 is another structural schematic diagram of a film layer of a second transistor provided by an embodiment of the present disclosure.

FIG. 14 is a structural schematic diagram of another film layer of the second transistor provided by an embodiment of the present disclosure. In the embodiment shown in FIG. 14, a film layer where the second transistor M2 is located includes an active layer 6, a gate layer 12, and a source-drain layer 13 arranged in sequence. The gate g of the second transistor M2 is located in the gate layer 12, a first terminal (not shown) and a second terminal d of the second transistor M2 are located in the source-drain layer 13. In a direction perpendicular to a plane where the active layer 6 is located, an orthographic projection of the source-drain layer 13 covers the active layer 6, and thus the source-drain layer 13 is used to shield the active layer 6 and to prevent ambient light or light reflected by the finger from irradiating on the active layer 6 and accelerating flowing of carriers. In this way, an increase in the leakage current of the second transistor M2 can be avoided.

Figure 15:
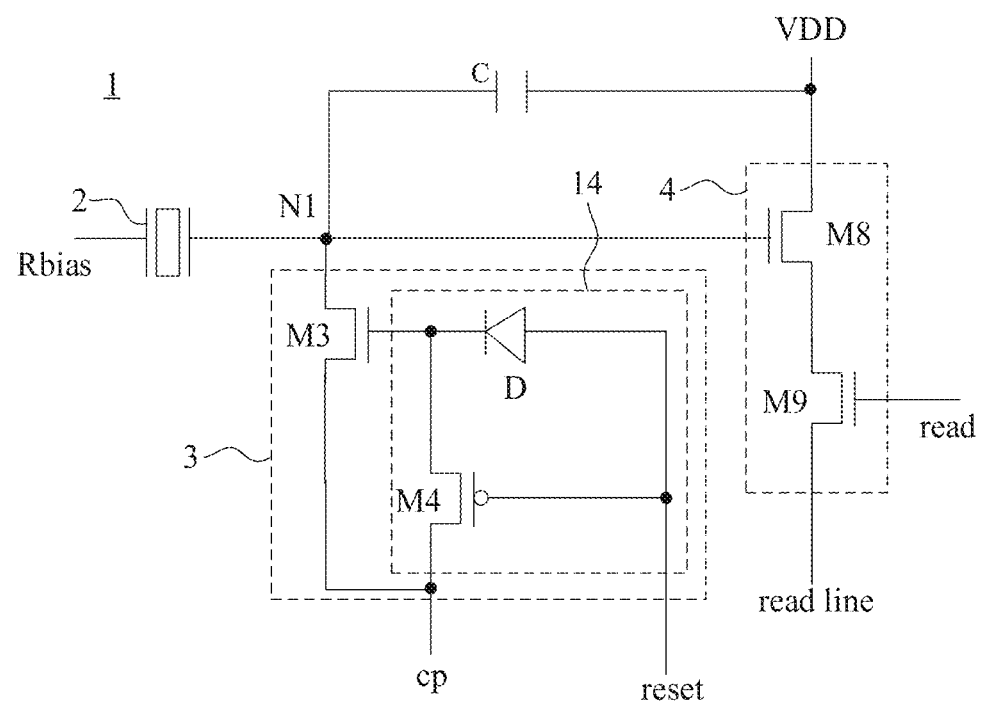
FIG. 15 is a schematic diagram of another circuit structure of a fingerprint identification unit provided by an embodiment of the present disclosure.
Figure 16:
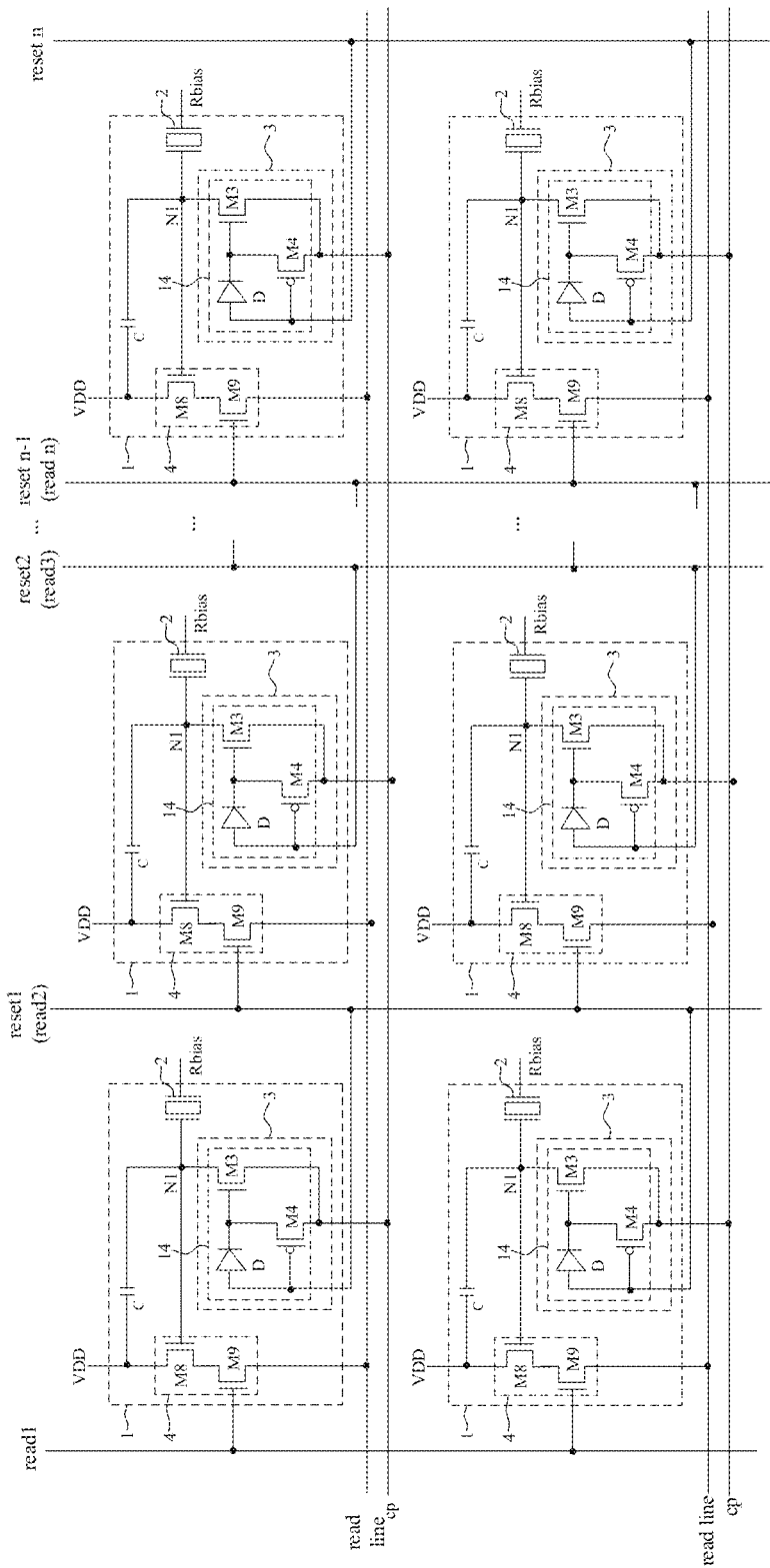
FIG. 16 is a structural schematic diagram of an ultrasonic fingerprint identification circuit corresponding to the fingerprint identification unit shown in FIG. 15.

FIG. 15 is a schematic diagram of another circuit structure of the fingerprint identification unit provided by the embodiment of the present disclosure, and FIG. 16 is a structural schematic diagram of an ultrasonic fingerprint identification circuit corresponding to the fingerprint identification unit shown in FIG. 15. In the embodiment shown in FIG. 15 and FIG. 16, the control module 3 includes a third transistor M3 and a switch unit 14, a first terminal of the third transistor M3 is electrically connected to the first node N1, and a second terminal of the third transistor M3 is electrically connected to the composite signal line cp; a gate of the third transistor M3 is electrically connected to the second terminal of the third transistor M3 through the switch unit 14, and the switch unit 14 is also electrically connected to the first control signal line reset.

For example, in combination with the timing shown in FIG. 3, in the overall resetting period t0, the first control signal line reset, the second control signal line read, and the composite signal line cp each provide the first level, and the switch unit 14 drives the third transistor M3 to be conducted under the first level provided by the first control signal line reset, and the first level provided by the composite signal line cp is transmitted to the first node N1 through the conducted third transistor M3, so as to perform the overall resetting on the first node N1. In the preparation period t2, the first control signal line reset provides the first level, and the switch unit 14 drives the third transistor M3 to be conducted under the first level provided by the first control signal line reset, and thus the second level provided by the composite signal line cp is transmitted to the first node N1 through the conducted third transistor M3, to maintain the second node at a stable low potential and to prevent the second node from being interfered by the ultrasonic signals. In the pull-up period t3, the composite signal line cp provides the first level, and the switch unit 14 drives the third transistor M3 to be conducted under the second level provided by the first control signal line reset, such that the first level provided by the composite signal line cp is transmitted to the first node N1 through the conducted third transistor M3, so as to pull up the potential at the first node N1.

Further referring to FIG. 15, the switch unit 14 includes a fourth transistor M4 and a diode D, a gate of the fourth transistor M4 is electrically connected to the first control signal line reset, a first terminal of the fourth transistor M4 is electrically connected to the gate of the third transistor M3, and a second terminal of the fourth transistor M4 is electrically connected to the second terminal of the third transistor M3. In combination with the timing shown in FIG. 3, the fourth transistor M4 is conducted in the pull-up period t3 under the second level provided by the first control signal line reset, so as to transmit the first level provided by the composite signal line cp to the gate of the third transistor M3 and to drive the third transistor M3 to be conducted. An anode of the diode D is electrically connected to the first control signal line reset, and a cathode of the diode D is electrically connected to the gate of the third transistor M3. The fourth transistor M4 is of an opposite type of the third transistor M3. Combined with the timing shown in FIG. 3, the diode D is conducted in the overall resetting period t0 and the preparation period t2 under the first level provided by the first control signal line reset, to transmit the high level provided by the first control signal line reset to the gate of the third transistor M3, so as to drive the third transistor M3 to be conducted. Through cooperation of the fourth transistor M4 and the diode D, the third transistor M3 can be in a corresponding turn-on or turn-off state in each period, which ensures normal operation of the circuit.

Figure 17:
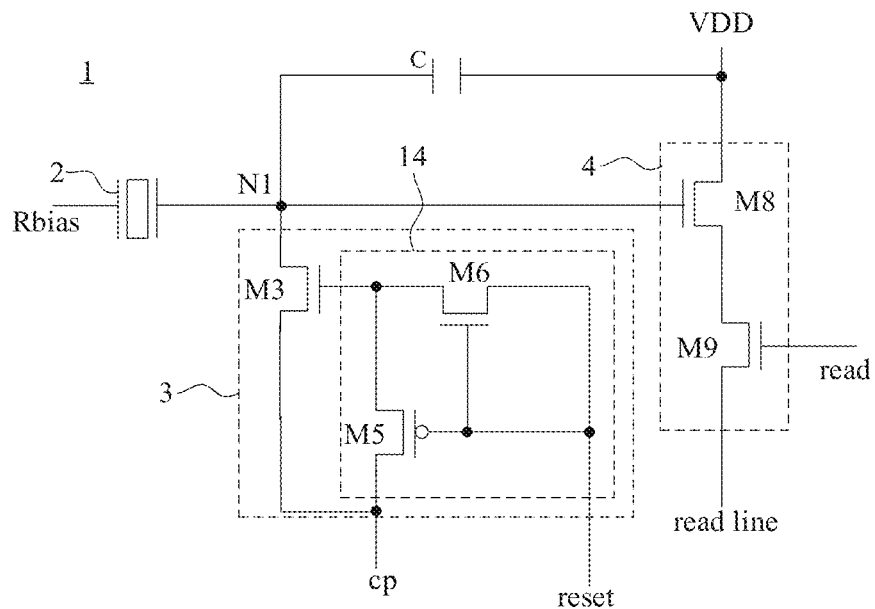
FIG. 17 is a schematic diagram of yet another circuit structure of a fingerprint identification unit provided by an embodiment of the present disclosure.

FIG. 17 is a schematic diagram of still another circuit structure of the fingerprint identification unit provided by the embodiment of the present disclosure. In the embodiment shown in FIG. 17, the switch unit 14 includes a fifth transistor M5 and a sixth transistor M6, the fifth transistor M5 and the third transistor M3 are of opposite types, and the sixth transistor M6 and the third transistor M3 are of the same type. A gate of the fifth transistor M5 is electrically connected to the first control signal line reset, a first terminal of the fifth transistor M5 is electrically connected to the gate of the third transistor M3, and a second terminal of the fifth transistor M5 is electrically connected to the second terminal of the third transistor M3. In combination with the timing shown in FIG. 3, the fifth transistor M5 is used to be conducted in the pull-up period t3 under the second level provided by the first control signal line reset, to transmit the first level provided by the composite signal line cp to the gate of the third transistor M3, and to drive the third transistor M3 to be conducted. A gate and a first terminal of the sixth transistor M6 are electrically connected to the first control signal line reset, and a second terminal of the sixth transistor M6 is electrically connected to the gate of the third transistor M3. In combination with the timing shown in FIG. 3, the sixth transistor M6 is used to be conducted in the overall resetting period t0 and the preparation period t2 under the first level provided by the first control signal line reset, to transmit the high level provided by the first control signal line reset to the gate of the third transistor M3, and to drive the third transistor M3 to be conducted. Through the cooperation of the fifth transistor M5 and the sixth transistor M6, the third transistor M3 can be in a corresponding turn-on or turn-off state in each period, which ensures normal operation of the circuit.

In addition, since the gate and the first terminal of the sixth transistor M6 are electrically connected, in combination with the previous discussion regarding the transistor TFT-D, the sixth transistor M6 has a relatively low leakage current when in the turn-off state, thereby ensuring the stability of the gate potential of the third transistor M3. Moreover, the sixth transistor M6 can be a low-temperature polysilicon transistor and has a relatively fast response speed.

In an embodiment, the third transistor M3 is a low-temperature polycrystalline oxide transistor or an amorphous silicon transistor, to ensure that the third transistor M3 has a relatively low leakage current in the turn-off state.

Further, in combination with the discussion regarding the second transistor M2 in the above embodiments, when the third transistor M3 is an amorphous silicon transistor, the thickness of the amorphous silicon layer of the third transistor M3 is L2, and L2 is set to satisfy: 200 Å≤L2≤1000 Å, in order to ensure that the third transistor M3 has a relatively low leakage current.

Figure 18:
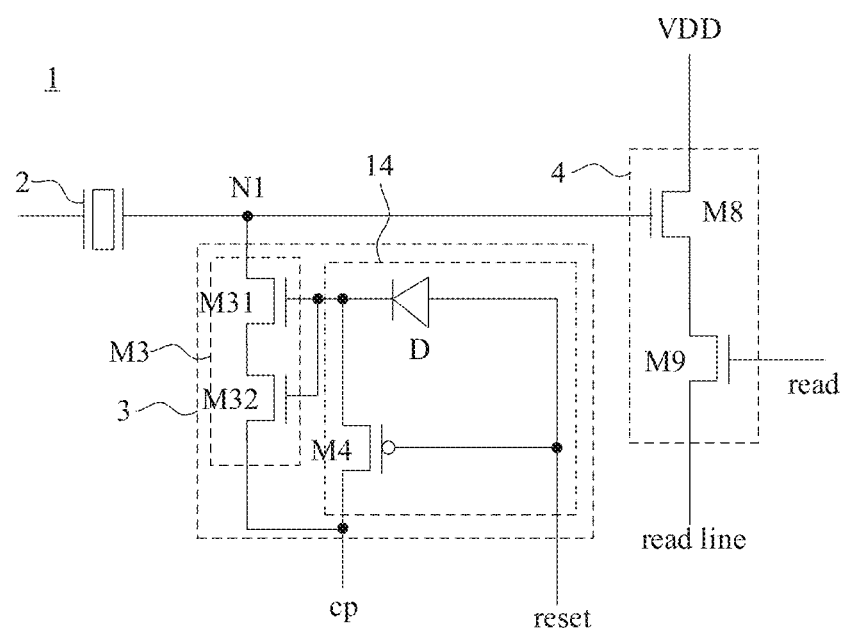
FIG. 18 is another structural schematic diagram of a fingerprint identification unit provided by an embodiment of the present disclosure.

FIG. 18 is another structural schematic diagram of the fingerprint identification unit provided by the embodiment of the present disclosure. In the embodiment shown in FIG. 18, the third transistor M3 includes a third sub-transistor M31 and a fourth sub-transistor M32 arranged in series, gates of the third sub-transistor M31 and the fourth sub-transistor M32 are electrically connected, a second terminal of the fourth sub-transistor M32 is electrically connected to a first terminal of the third sub-transistor M31, a first terminal of the fourth sub-transistor M32 is electrically connected to the composite signal line cp, and a second terminal of the third sub-transistor M31 is electrically connected to the first node N. As the third transistor M3 has two sub-transistors connected in series, the third transistor M3 in the layout design can have an increased length, which reduces the width-to-length ratio of the third transistor M3 and thus reduces the leakage current of the third transistor M3 in the turn-off state.

Figure 19:
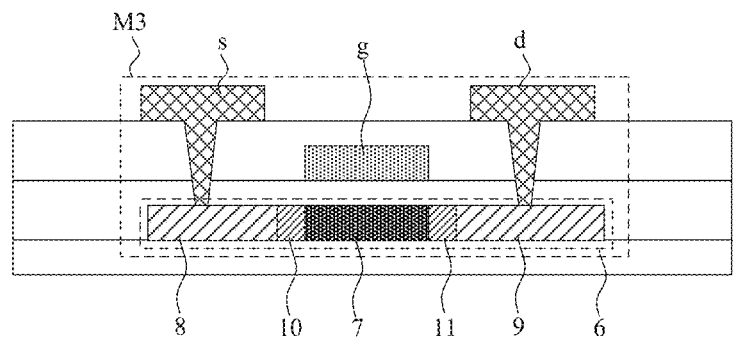
FIG. 19 is a structural schematic diagram of a film layer of a third transistor provided by an embodiment of the present disclosure.

FIG. 19 is a structural schematic diagram of the film layer of the third transistor provided by an embodiment of the present disclosure. In the embodiment shown in FIG. 19, the third transistor M3 includes an active layer 6, the active layer 6 includes a channel region 7, a first heavily doped region 8 and a second heavily doped region 9; the first terminal of the third transistor M3 is electrically connected to the first heavily doped region 8, and the second terminal of the third transistor M3 is electrically connected to the second heavily doped region 9; a first lightly doped region 10 is provided between the first heavily doped region 8 and the channel region 7, a second lightly doped region 11 is provided between the second heavily doped region 9 and the channel region 7. The lightly doped regions are used to balance a doping concentration of the doped region, so as to reduce the leakage current generated between the first terminal and the second terminal, thereby reducing the leakage current of the third transistor M3.

It should be noted that, in combination with FIG. 15, since the diode D is a unidirectional conduction structure, in the initial state, if the gate potential of the third transistor M3, i.e., a potential of the cathode of the diode D is uncertain, then the diode D may be in a reverse bias state, such that the first level provided by the first control signal line reset cannot be transmitted to the gate of the third transistor M3, thereby resulting in a failure of the circuit.

Figure 20:
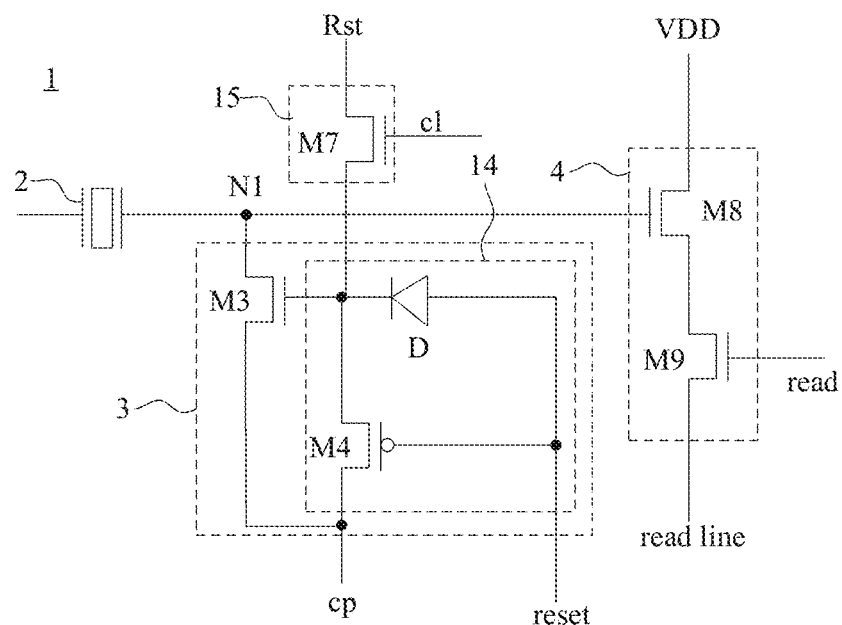
FIG. 20 is a structural schematic diagram of a fingerprint identification unit provided by another embodiment of the present disclosure.

FIG. 20 is another structural schematic diagram of the fingerprint identification unit provided by the embodiment of the present disclosure. In the embodiment of the present disclosure shown in FIG. 20, the control module 3 also includes a reset unit 15, and the reset unit 15 is electrically connected to the third control signal line cl, the reset signal line Rst and the gate of the third transistor M3, for transmitting the reset signal provided by the reset signal line Rst to the gate of the third transistor M3 under an action of an effective level provided by the third control signal line cl, to reset the gate of the third transistor M3, and the effective level is the first level or the second level.

Figure 21:
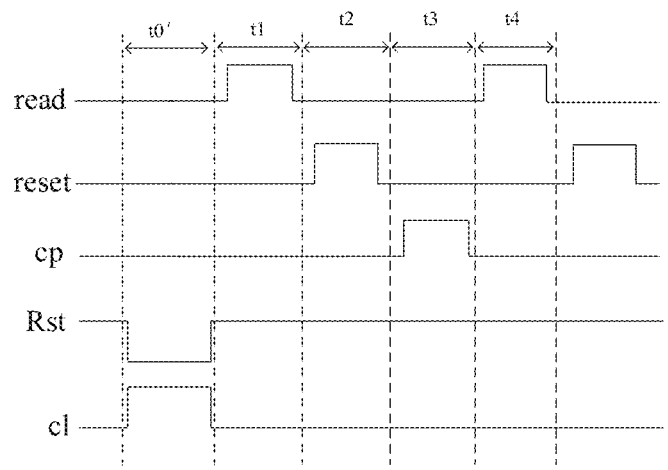
FIG. 21 is a timing diagram corresponding to a circuit structure shown in FIG. 20.

FIG. 21 is a timing diagram corresponding to the circuit structure shown in FIG. 20. For example, as shown in FIG. 21, the driving cycle also includes a node resetting period t0' prior to the preparation period. It should be noted that, when the driving cycle includes the initial voltage reading period t1, the node resetting period t0' is prior to the initial voltage reading period t1. In the node resetting period t0', by resetting the cathode of the diode D using the reset unit 15, the cathode of the diode D can be maintained at a stable low potential, to avoid reverse biasing the diode D, ensure the reliability of the subsequent operation of the diode D, and improve the stability of the circuit operation.

Further referring to FIG. 20, the reset unit 15 includes a seventh transistor M7, a gate of the seventh transistor M7 is electrically connected to the third control signal line cl, a first terminal of the seventh transistor M7 is electrically connected to the reset signal line Rst, and a second terminal of the seventh transistor M7 is electrically connected to the gate of the third transistor M3. When the seventh transistor M7 is an N-type transistor, the above effective level is the first level, and when the seventh transistor M7 is a P-type transistor, the above effective level is the second level. In combination with the timing shown in FIG. 21, the seventh transistor M7 is conducted under the first level or the second level provided by the third control signal line cl, and the reset signal provided by the reset signal line Rst is transmitted to the gate of the third transistor M3 via the conducted seventh transistor M7, so as to reset the gate of the third transistor M3 and the cathode of the diode D.

It should be noted that, in combination with FIG. 15, in other optional embodiments of the present disclosure, the reset unit 15 may not be provided, and before the initial voltage reading period t1, the first control signal line reset and the composite signal line cp are directly allowed to provide the second level, such that the fourth transistor M4 is conducted under the second level provided by the first control signal line reset, so as to transmit the second level provided by the composite signal line cp to the gate of the third transistor M3 and to reset the gate of the third transistor M3 and the cathode of the diode D.

In an embodiment, referring to FIG. 7, FIG. 15 and FIG. 17, the reading module 4 includes an eighth transistor M8 and a ninth transistor M9, a gate of the eighth transistor M8 is electrically connected to the first node N1, and a first terminal of the eighth transistor M8 is electrically connected to a fixed potential signal line VDD; a gate of the ninth transistor M9 is electrically connected to the second control signal line read, a first terminal of the ninth transistor M9 is electrically connected to a second terminal of the eighth transistor M8, and a second terminal of the ninth transistor M9 is electrically connected to the reading signal line read line.

For example, during the pull-up period t3, the ultrasonic fingerprint identification sensor 2 converts the ultrasonic signal reflected by the finger into an electrical signal, which is a signal fluctuating between high and low potentials. Since the potential of the first node N1 is the gate potential of the eighth transistor M8, the potential of the first node N1 can control the conduction state of the eighth transistor M8. In order to prevent the low potential of the electrical signal from affecting the conduction state of the eighth transistor M8 and resulting in unstable operation of the eighth transistor M8, the potential of the first node N1 is pulled up to a reasonable extent by using the control module 3. Thus, in the detection voltage reading period t4, the gate potential of the eighth transistor M8 satisfies: Vgs>Vth, and Vds>Vgs-Vth. In this case, the eighth transistor M8 is in a saturated state, and according to saturation characteristics of the transistor, it can be known that a source-drain current Ids of the eighth transistor M8 is independent of a source-drain voltage Vds and can be only increased when the gate-source voltage Vgs increases. In this regard, when the detection voltage of the first node N1 is relatively high, the Vgs of the eighth transistor is relatively large, and correspondingly, a current transferred from the eighth transistor M8 to the ninth transistor M9 is also relatively large, and thus the signal intensity read by the reading signal line read line and configured to feed back the detection voltage of the first node N1 is also relatively large. When the detection voltage of the first node N1 is relatively low, the Vgs of the eighth transistor M8 is relatively small, and correspondingly, the current transferred from the eighth transistor M8 to the ninth transistor M9 is relatively small, which results in the small read signal intensity configured to feed back the detection voltage of the first node N1, thereby obtaining the magnitude of the detection voltage at the first node N1 according to the read signal intensity.

In an embodiment, referring to FIG. 7, FIG. 15 and FIG. 17, the fingerprint identification unit 1 further includes a storage capacitor C, a first plate of the storage capacitor C is electrically connected to the first node N1, and a second plate of the storage capacitor C is electrically connected to the fixed potential signal line VDD, so that the storage capacitor C is used to stabilize the potential of the first node N1 in the pull-up period t3. Moreover, in the circuit structure shown in FIG. 7, in the pull-up period t3, the unidirectionally conducted second transistor M2 can further keep the charge of the storage capacitor C until the reading is completed, thereby further improving the stability of the potential at the first node N1 during the reading process.

Figure 22:
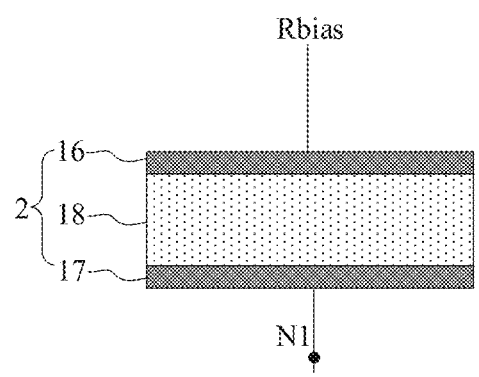
FIG. 22 is a structural schematic diagram of an ultrasonic fingerprint identification sensor provided by an embodiment of the present disclosure.

FIG. 22 is a structural schematic diagram of an ultrasonic fingerprint identification sensor provided by an embodiment of the present disclosure. In the embodiment shown in FIG. 22, the ultrasonic fingerprint identification sensor 2 includes: a first electrode 16 electrically connected to the detection signal line Rbias, a second electrode 17 disposed opposite to the first electrode 16 and electrically connected to the first node N1, and an ultrasonic material layer 18 located between the first electrode 16 and the second electrode 17. For example, in the preparation period t2, the detection signal line Rbias outputs an electrical signal for identification to the first electrode 16 of the ultrasonic fingerprint identification sensor 2, and the ultrasonic material layer 18 converts the electrical signal into the ultrasonic signal and radiates it towards the finger; in the pull-up period t3, the ultrasonic signal reflected by the finger is reflected back, and the ultrasonic material layer 18 converts the reflected ultrasonic signal into an electrical signal and transmits it to the first node N1 through the second electrode 17, thereby achieving the normal operation of the ultrasonic fingerprint identification sensor 2.

Figure 23:
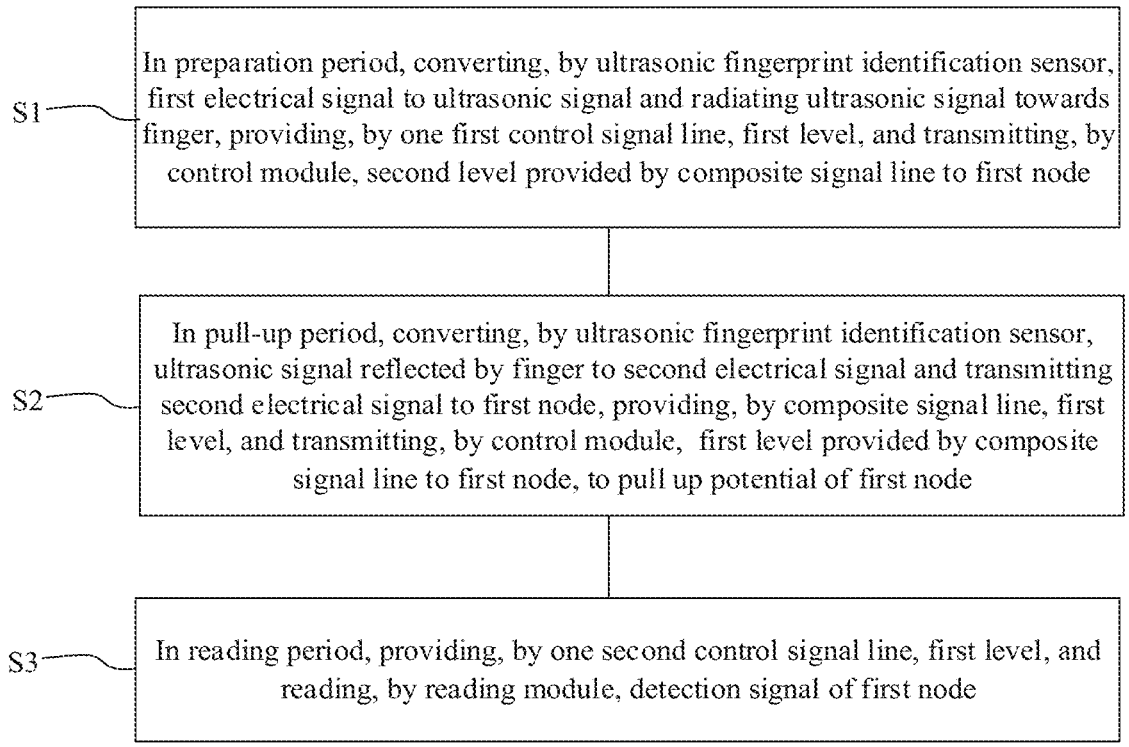
FIG. 23 is a flowchart of a driving method provided by an embodiment of the present disclosure.

The embodiment of the present disclosure also provides a driving method of the ultrasonic fingerprint identification circuit, for driving the above ultrasonic fingerprint identification circuit. With reference to FIG. 1, the driving cycle of the fingerprint identification unit 1 of the ultrasonic fingerprint identification circuit includes a preparation period, a pull-up period, and a detection voltage reading period. FIG. 23 is a flowchart of a driving method provided by an embodiment of the present disclosure. As shown in FIG. 23, the driving method includes the following steps.

Step S1: in the preparation period, the ultrasonic fingerprint identification sensor 2 converts an electrical signal into an ultrasonic signal and radiates it towards the finger, the first control signal line reset provides the first level, the control module 3 transmits the second level provided by the composite signal line cp to the first node N1, that is, to provide the reset potential to the first node N1, so that the first node N1 is maintained at a stable low potential.

Step S2: in the pull-up period, the ultrasonic fingerprint identification sensor 2 converts the ultrasonic signal reflected by the finger into an electrical signal and transmits it to the first node N1, the composite signal line cp provides the first level, and the control module 3 transmits the first level provided by the composite signal line cp to the first node N1, to pull up the potential of the first node N1, that is, to perform wave-chopping on the electric signal converted by the ultrasonic signal.

Figure 24:
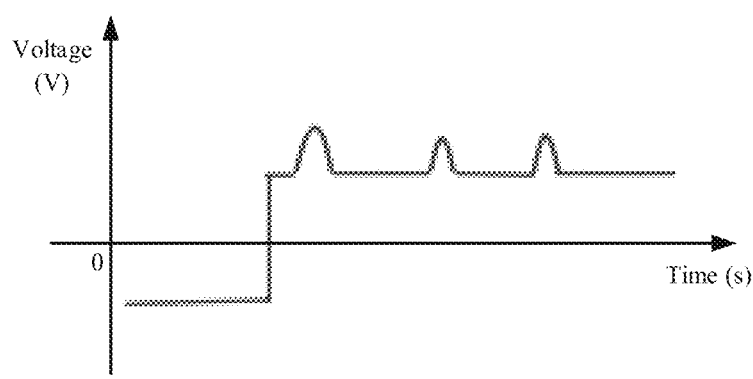
FIG. 24 is a waveform diagram of an electrical signal converted from an ultrasonic signal and subjected to a wave chopping according to an embodiment of the present disclosure.

It should be noted that the electrical signal converted by the ultrasonic signal is a signal fluctuating between the high and low potentials, and the highest potential in the electrical signal is used for subsequent detection and identification, thus pull-up potential will only pull up the low potential in the electrical signal to a reasonable extent, the pulled-up potential will not cover an original highest potential in the electrical signal, and the waveform diagram of the electrical signal converted from the ultrasonic signal after the wave-chopping is as shown in FIG. 24.

Step S3: in the reading period, the second control signal line read provides the first level, and the reading module 4 reads the detection signal of the first node N1.

In the fingerprint identification circuit driven by the above driving method, the first control signal line reset electrically connected to one fingerprint identification unit 1 can be reused as the second control signal line read electrically connected to another fingerprint identification unit 1, thereby greatly reducing the number of the control signal lines required to be provided. On the one hand, the space occupied by the control signal lines can be reduced and saved for the design space of the ultrasonic fingerprint identification circuit; and on the other hand, the coupling between the control signal lines and the coupling between the control signal lines and other wirings can also be reduced, so as to reduce interference of coupling capacitance on the read signal and improve accuracy of the read signal, thereby improving accuracy of the fingerprint identification.

Figure 25:
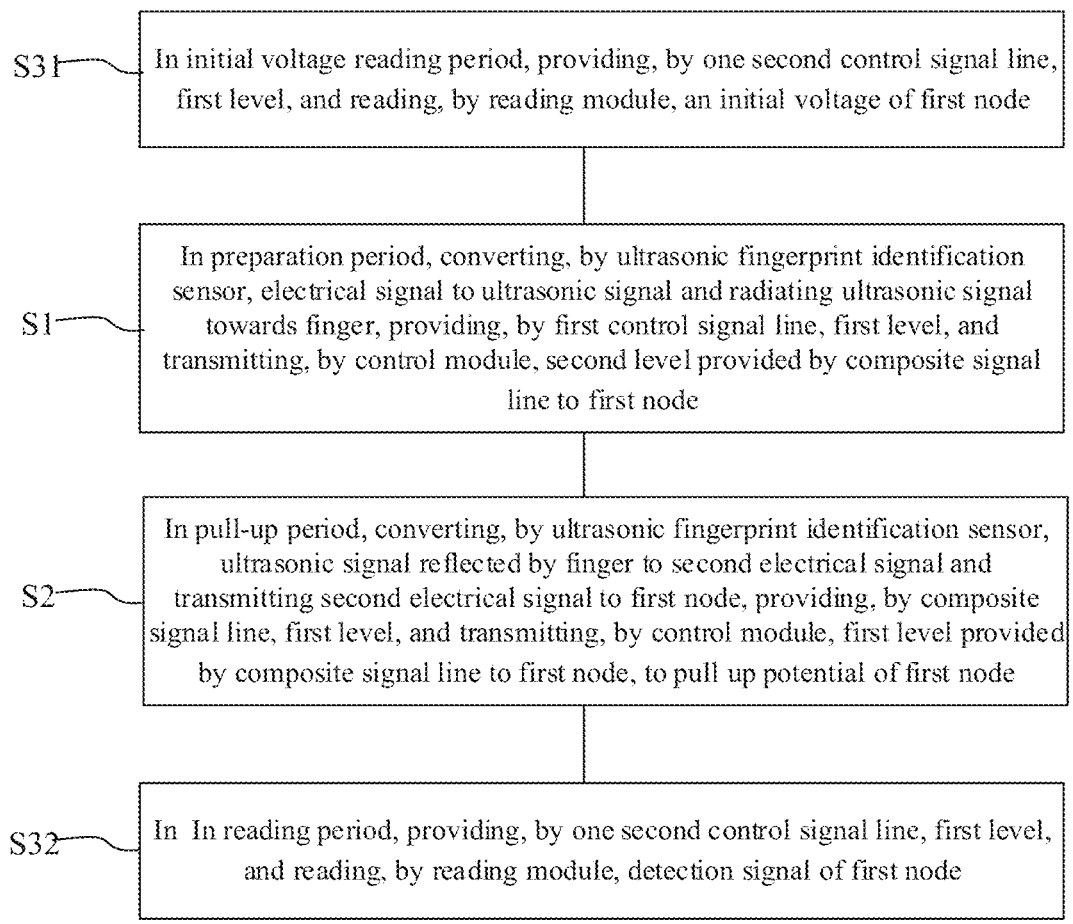
FIG. 25 is another flowchart of a driving method provided by an embodiment of the present disclosure.

Further, in combination with FIG. 2, the reading period includes an initial voltage reading period t1 prior to the preparation period t2, and a detection voltage reading period t4 latter than the pull-up period t3. That is, the driving cycle of the fingerprint identification unit 1 of the ultrasonic fingerprint identification circuit includes an initial voltage reading period t1, a preparation period t2, a pull-up period t3, and a detection voltage reading period t4. FIG. 25 is another flowchart of the driving method provided by the embodiment of the present disclosure. As shown in FIG. 25, Step S3 includes the following steps.

Step S31: in the initial voltage reading period t1, the second control signal line read provides the first level, and the reading module 4 reads the initial voltage V1 of the first node N1.

Step S32: in the detection voltage reading period t4, the second control signal line read provides the first level, and the reading module 4 reads the detection voltage of the first node N1.

Furthermore, the processor is configured to identify of fingerprint valleys and the fingerprint ridges by determining a difference between V1 and V2 according to the V1 and V2 read in a time-division manner.

Using the above reading method, in the driving cycle of one frame, the voltage of the first node N1 is read twice in a time division manner respectively in the initial voltage reading period t1 and the detection voltage reading period t4, and the valleys and ridges of the fingerprint are determined based on a difference between the two voltages. Therefore, even if the read signal contains the noise signal, the noise signal can be eliminated by differencing the two voltages, thereby reducing the influence of the noise signal on the detection accuracy and effectively enhancing a signal-to-noise ratio.

In an embodiment, referring to FIG. 3, the driving cycle further includes an overall resetting period t0 prior to the initial voltage reading period t1. In combination with the timing shown in FIG. 3, in the overall resetting period t0, the first control signal line reset, the second control signal line read, and the composite signal line cp each provide the first level, and the control module 3 transmits the first level provided by the composite signal line cp to the first node N1, in order to reset the first node N1.

Figure 26:
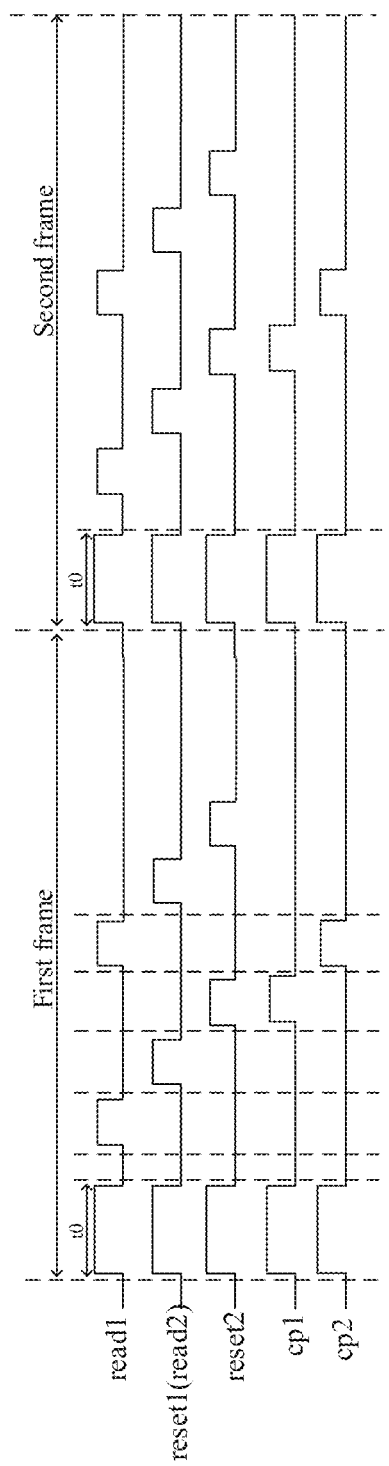
FIG. 26 is another timing diagram provided by an embodiment of the present disclosure.

FIG. 26 is another timing diagram provided by an embodiment of the present disclosure. In the embodiment of the present disclosure, as shown in FIG. 26, the overall resetting is performed in each frame of the driving cycle, so that the voltages of the first nodes N1 in the respective fingerprint identification units 1 in each frame are uniformly reset to a high potential, and magnitudes of the initial voltages read by the respective fingerprint identification units 1 in each frame in the initial voltage reading period t1 are uniform, thereby avoiding the impact of the difference of the initial voltage on the identification accuracy.

In an embodiment, referring to FIG. 7, the control module 3 includes a first transistor M1 and a second transistor M2. A gate of the first transistor M1 is electrically connected to the first control signal line reset, a first terminal of the first transistor M1 is electrically connected to the first node N1, and a second terminal of the first transistor M1 is electrically connected to the composite signal line cp. A gate and a second terminal of the second transistor M2 is respectively electrically connected to the composite signal line cp, and a first terminal of the second transistor M2 is electrically connected to the first node N1.

Based on the above structure, in combination with the timing shown in FIG. 3, in the preparation period t2, the process of transmitting, by the control module 3, the second level provided by the composite signal line cp to the first node N1 includes: in the preparation period t2, the first control signal line reset provides a first level, the composite signal line cp provides a second level, the first transistor M1 is conducted under the first level, the second level provided by the composite signal line cp is transmitted to the first node N1 through the conducted first transistor M1, such that the first node N1 is maintained at a stable low potential, thereby preventing the first node N1 from being interfered by ultrasonic signals.

In combination with the timing shown in FIG. 3, in the pull-up period t3, the process of transmitting, by the control module 3, the first level provided by the composite signal line cp to the first node N1 to pull up the potential of the first node N1 includes: in the pull-up period t3, the first control signal line reset provides the second level, the composite signal line cp provides the first level, the second transistor M2 is conducted under the first level, the first level provided by the composite signal line cp is transmitted to the first node N1 via the conducted second transistor M2, so as to pull up the potential of the first node N1 with the first level.

Since the gate and the second terminal of the second transistor M2 are electrically connected to each other, the second transistor M2 can be in a unidirectional conduction state when it is conducted, and in the detection voltage reading period t4, when the second transistor M2 is turned off under the second level provided by the composite signal line cp, the leakage current of the second transistor M2 in the turn-off state is very small, and thus the loss of the charge of the first node N1 is also very small, thereby reducing the influence of the leakage current on the potential of the first node N1, improving the stability of the potential of the first node N1, and improving the accuracy of the read voltage of the first node N1.

In an embodiment, referring to FIG. 15 again, the control module 3 includes: a third transistor M3, a fourth transistor M4 and a diode D. A first terminal of the third transistor M3 is electrically connected to the first node N1, and a second terminal of the third transistor M3 is electrically connected to the composite signal line cp. A gate of the fourth transistor M4 is electrically connected to the first control signal line reset, a first terminal of the fourth transistor M4 is electrically connected to the gate of the third transistor M3, and a second terminal of the fourth transistor M4 is electrically connected to the second terminal of the third transistor M3. A type of the fourth transistor M4 is opposite to that of the third transistor M3. An anode of the diode D is electrically connected to the first control signal line reset, and a cathode of the diode D is electrically connected to the gate of the third transistor M3.

Based on the above structure, in combination with the timing shown in FIG. 3, in the preparation period t2, the process of transmitting, by the control module 3, the second level provided by the composite signal line cp to the first node N1 includes: in the preparation period t2, the first control signal line reset provides a first level, the composite signal line cp provides a second level, the diode D is conducted under the second level to allow the third transistor M3 to be conducted under the first level provided by the first control signal line reset, so as to transmit the second level provided by the composite signal line cp to the first node N1.

In this way, the second node is maintained at a stable low potential and thus is prevented from being interfered by ultrasonic signals.

In combination with the timing shown in FIG. 3, in the pull-up period t3, the process of transmitting, by the control module 3, the first level provided by the composite signal line cp to the first node N1 to pull up the potential of the first node N1 includes: in the pull-up period t3, the first control signal line reset provides the second level, the composite signal line cp provides the first level, the fourth transistor M4 is conducted under the second level to allow the third transistor M3 to be conducted under the first level provided by the composite signal line cp, so as to transmit the first level provided by the composite signal line cp to the first node N1, thereby pulling up the potential of the first node N1.

Through cooperation of the fourth transistor M4 and the diode D, the third transistor M3 can be in a corresponding turn-on or turn-off state in each period, such that the first node N1 can accurately receive the required potential in each period, ensuring the normal operation of the circuit.

In an embodiment, referring to FIG. 19, the control module 3 includes: a third transistor M3, a fifth transistor M5, and a sixth transistor M6. A first terminal of the third transistor M3 is electrically connected to the first node N1, and a second terminal of the third transistor M3 is electrically connected to the composite signal line cp. A gate of the fifth transistor M5 is electrically connected to the first control signal line reset, a first terminal of the fifth transistor M5 is electrically connected to the gate of the third transistor M3, and a second terminal of the fifth transistor M5 is electrically connected to the second terminal of the third transistor M3. The fifth transistor M5 and the third transistor M3 are of opposite types. A gate and a first terminal of the sixth transistor M6 are electrically connected to the first control signal line reset, and a second terminal of the sixth transistor M6 is electrically connected to the gate of the third transistor M3. The sixth transistor M6 is of the same type as the third transistor M3.

Based on the above structure, in combination with the timing shown in FIG. 3, in the preparation period t2, the process of transmitting, by the control module 3, the second level provided by the composite signal line cp to the first node N1 includes: in the preparation period t2, the first control signal line reset provides a first level, the composite signal line cp provides a second level, and the sixth transistor M6 is conducted under the second level to allow the third transistor M3 to be conducted under the first level provided by the first control signal line reset, so as to transmit the second level provided by the composite signal line cp to the first node N1. Thus, the second node is maintained at a stable low potential and is prevented from being interfered by ultrasonic signals.

In combination with the timing shown in FIG. 3, in the pull-up period t3, the process of transmitting, by the control module 3, the first level provided by the composite signal line cp to the first node N1 to pull up the potential of the first node N1 includes: in the pull-up period t3, the first control signal line reset provides the second level, the composite signal line cp provides the first level, and the fifth transistor M5 is conducted under the second level to allow the third transistor M3 to be conducted under the first level provided by the composite signal line cp, so as to transmit the first level provided by the composite signal line cp to the first node N1, thereby pulling up the potential of the first node N1.

Through the cooperation of the fifth transistor M5 and the sixth transistor M6, the third transistor M3 can be in a corresponding on turn-or turn-off state in each period, such that the first node N1 can accurately receive the required potential in each period, ensuring the normal operation of the circuit. In addition, since the gate and the first terminal of the sixth transistor M6 are electrically connected to each other, in combination with the previous discussion regarding the transistor TFT-D, the sixth transistor M6 has a relatively low leakage current when it is in the turn-off state, thereby ensuring the stability of the gate potential of the third transistor M3.

Further, referring to FIG. 20 and FIG. 21, the control module 3 further includes a reset unit 15, and the reset unit 15 is electrically connected to the third control signal line cl, the composite signal line cp, and the gate of the third transistor M3.

Based on the above structure, in combination with the timing shown in FIG. 21, the driving cycle further includes a node resetting period t0' prior to the initial voltage reading period t1. In the node resetting period t0', the third control signal line cl provides an effective level, the reset unit 15 transmits the reset signal provided by the composite signal line cp to the gate of the third transistor M3 to reset the gate of the third transistor M3, and the effective level is the first level or the second level. By using the reset unit 15 to reset the gate of the third transistor M3 and the cathode of the diode D, the cathode of the diode D can be maintained at a stable low potential, and thus the diode D is avoided to be in a reverse bias state that may be caused by the instability of the node voltage, thereby ensuring the reliability of the subsequent operation of the diode D, and improving the stability of the circuit operation.

In an embodiment, referring to FIG. 7, FIG. 15 and FIG. 17, the reading module 4 includes an eighth transistor M8 and a ninth transistor M9. A gate of the eighth transistor M8 is electrically connected to the first node N1, and a first terminal of the eighth transistor M8 is electrically connected to the fixed potential signal line. A gate of the ninth transistor M9 is electrically connected to the second control signal line read, a first terminal of the ninth transistor M9 is electrically connected to a second terminal of the eighth transistor M8, and a second terminal of the ninth transistor M9 is electrically connected to the reading signal line read line.

Based on the above structure, in combination with the timing shown in FIG. 3, in the initial voltage reading period t1, the process of reading, by the reading module 4, the initial voltage of the first node N1 includes: in the initial voltage reading period t1, the second control signal line read provides the first level, and the ninth transistor M9 is conducted under the first level, to transmit a signal for feeding back a magnitude of the initial voltage of the first node N1 to the reading signal line read line.

In combination with the timing shown in FIG. 3, in the detection voltage reading period t4, the process of reading, by the reading module 4, the detection voltage of the first node N1 includes: in the detection voltage reading period t4, the eighth transistor M8 is located in a saturation region under the potential of the first node N1, the second control signal line read provides the first level, and the ninth transistor M9 is conducted under the first level, to transmit a signal for feeding back the magnitude of the detection voltage of the first node N1 to the reading signal line read line.

It should be noted that, in the pull-up period t3, the control module 3 pulls up the potential of the first node N1 to a reasonable extent, and in the detection voltage reading period t4, the gate potential of the eighth transistor M8 satisfies: Vgs>Vth, and Vds>Vgs-Vth. In this case, the eighth transistor M8 is in a saturated state, and according to the saturation characteristics of the transistor, it can be known that a source-drain current Ids of the eighth transistor M8 is independent of a source-drain voltage Vds and will be only increased when the gate-source voltage Vgs increases. In this regard, when the detection voltage of the first node N1 is relatively high, the Vgs of the eighth transistor is relatively large, and correspondingly, a current transferred from the eighth transistor M8 to the ninth transistor M9 is also relatively large. Thus, the signal intensity that is read by the reading signal line read line and used to feed back the detection voltage of the first node N1 is relatively large. When the detection voltage of the first node N1 is relatively low, the Vgs of the eighth transistor is relatively small, and correspondingly, the current transmitted from the eighth transistor M8 to the ninth transistor M9 is relatively small. Thus, the read signal intensity used to feed back the detection voltage of the first node N1 is also relatively small, so as to obtain the magnitude of the detection voltage of the first node N1 according to the read signal intensity.

In an embodiment, referring to FIG. 7, FIG. 15 and FIG. 17, the fingerprint identification unit 1 further includes a storage capacitor C, a first plate of the storage capacitor C is electrically connected to the first node N1, and a second plate of the storage capacitor C is electrically connected to the fixed potential signal line VDD. The driving method further includes: in the pull-up period t3, the charges of the first node N1 are stored by using the storage capacitor C, thereby stabilizing the potential of the first node N1 with the storage capacitor C. In the circuit structure shown in FIG. 7, in the pull-up period t3, the unidirectionally conducted second transistor M2 can further keep the charges of the storage capacitor C until the reading is completed, thereby further improving the stability of the potential of the first node N1 during the reading process.

Figure 27:
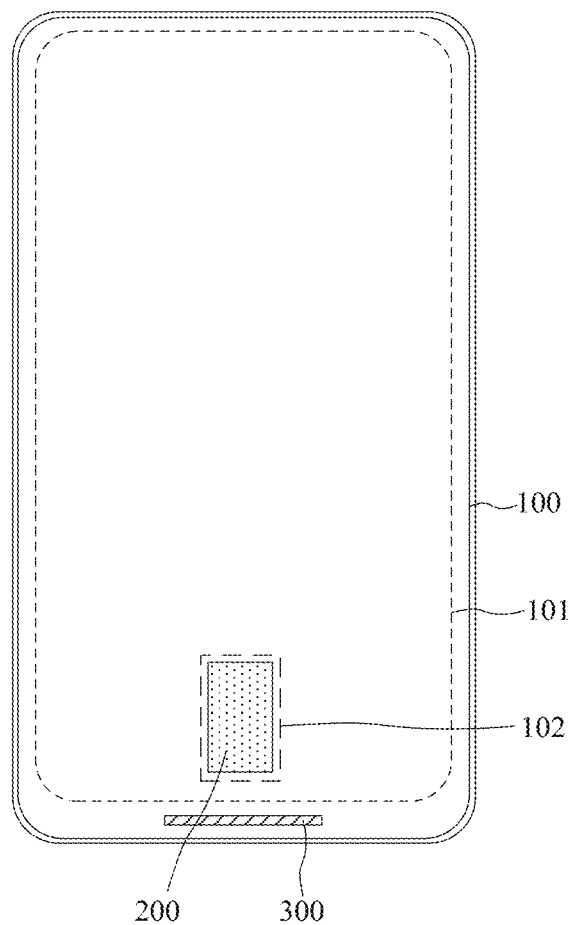
FIG. 27 is a structural schematic diagram of a display device provided by an embodiment of the present disclosure.

The embodiment of the present disclosure also provides a display device. FIG. 27 is a structural schematic diagram of the display device provided by the embodiment of the present disclosure. As shown in FIG. 27, the display device includes: a display panel 100, the above ultrasonic fingerprint identification circuit 200, and a processor 300. A display area of the display panel includes a main display area 101 and a fingerprint identification area 102. The ultrasonic fingerprint identification circuit is provided in the fingerprint identification area 102. The processor is electrically connected to the reading signal line read line (not shown) in the ultrasonic fingerprint identification circuit 200, and configured to identify fingerprints according to the signal read by the reading signal line read line. The specific structure of the ultrasonic fingerprint identification circuit 200 has been described in detail in the foregoing embodiments, which will not be repeated herein. The display device shown in FIG. 26 is an example, and the display device may be any electronic device with a display function, such as a mobile phone, a tablet computer, a notebook computer, an electronic paper book, or a television.

Since the display device provided by the embodiment of the present disclosure includes the above ultrasonic fingerprint identification circuit 200, the display device can greatly reduce the number of the control signal lines required by the ultrasonic fingerprint identification circuit 200, thereby saving the design space for the ultrasonic fingerprint identification circuit and reducing the interference of the coupling capacitance generated by the control signal lines on the read signal; and the display device can also lower the influence of the noise signal on the detection accuracy, thereby increasing the signal-to-noise ratio and effectively improving the accuracy of fingerprint identification.

The above are only preferred embodiments of the present disclosure, but not intended to limit the present disclosure. Any modifications, equivalent replacements, improvements, etc. made within the spirit and principle of the present disclosure shall be included in the protection scope of the present disclosure.

It should be noted that the above various embodiments are only used to illustrate, but not to limit the technical solutions of the present disclosure. Although the present disclosure has been described in detail with reference to the above various embodiments, those skilled in the art can modify the technical solutions described in the above various embodiments, or equivalently replace some or all of the technical features, without departing from the scope of the technical solutions of the various embodiments of the present disclosure.

What is claimed is:

1. An ultrasonic fingerprint identification circuit, comprising a plurality of fingerprint identification units, each of the plurality of fingerprint identification units comprising:
    an ultrasonic fingerprint identification sensor electrically connected to a first node, wherein the ultrasonic fingerprint identification sensor is configured to: convert a first electrical signal to an ultrasonic signal and radiate the ultrasonic signal towards a finger, and convert an ultrasonic signal reflected by the finger to a second electrical signal and transmit the second electrical signal to the first node;
    a control circuit electrically connected to a composite signal line, the first node, and one first control signal line of a plurality of first control signal lines, wherein the control circuit is configured to: provide a reset potential to the first node in response to a first level provided by the one of the plurality of first control signal lines, and provide a pull-up potential to the first node in response to the first level provided by the composite signal line; and
    a reading circuit electrically connected to the first node, a reading signal line, and one second control signal line of a plurality of second control signal lines, wherein the reading circuit is configured to read a detection signal of the first node in response to a first level provided by the one second control signal line,
    wherein one of the plurality of first control signal lines electrically connected to one of the plurality of fingerprint identification units is reused as one of the plurality of second control signal lines electrically connected to another one of the plurality of fingerprint identification units,
    wherein the control circuit comprises:
    a switch unit electrically connected to the one first control signal line; and
    a third transistor comprising a first terminal electrically connected to the first node, a second terminal electrically connected to the composite signal line, and a gate electrically connected to the second terminal of the third transistor through the switch unit, and
    wherein the third transistor comprises an active layer, the active layer comprises a channel region, a first heavily doped region, a second heavily doped region, a first lightly doped region provided between the first heavily doped region and the channel region, and a second lightly doped region provided between the second heavily doped region and the channel region, wherein the first terminal of the third transistor is electrically connected to the first heavily doped region, and wherein the second terminal of the third transistor is electrically connected to the second heavily doped region.

2. The ultrasonic fingerprint identification circuit according to claim 1, wherein a plurality of fingerprint identification unit groups is arranged along a first direction, each of the plurality of fingerprint identification unit groups comprises at least two fingerprint identification units of the plurality of fingerprint identification units, the at least two fingerprint identification units are arranged along a second direction, and the first direction intersects the second direction;

wherein the at least two fingerprint identification units are electrically connected to one of the plurality of first control signal lines and one of the plurality of second control signal lines; and wherein for any two adjacent ones of the plurality of fingerprint identification unit groups, one of the plurality of first control signal lines corresponding to one fingerprint identification unit group is reused as one of the plurality of second control signal lines corresponding to the other one fingerprint identification unit group.

3. The ultrasonic fingerprint identification circuit according to claim 2, wherein the plurality of first control signal lines and the plurality of second control signal lines are alternatively arranged, each of the plurality of first control signal lines and the plurality of second control signal lines is arranged in a gap formed between two adjacent ones of the plurality of fingerprint identification unit groups, and one of one of the plurality of first control signal lines and one of the plurality of second control signal lines is arranged in a gap between every two adjacent ones of the plurality of fingerprint identification unit groups; and wherein one of the plurality of first control signal lines corresponding to an i-th fingerprint identification unit group of the plurality of fingerprint identification unit groups is provided in a gap formed between the i-th fingerprint identification unit group and an (i+1)-th fingerprint identification unit group of the plurality of fingerprint identification unit groups.

4. The ultrasonic fingerprint identification circuit according to claim 1, wherein the switch unit comprises:

a fourth transistor comprising a gate electrically connected to the one first control signal line, a first terminal electrically connected to the gate of the third transistor, and a second terminal electrically connected to the second terminal of the third transistor; and a diode comprising an anode electrically connected to the one first control signal line, and a cathode electrically connected to the gate of the third transistor, wherein a type of the fourth transistor is opposite to a type of the third transistor.

5. The ultrasonic fingerprint identification circuit according to claim 4, wherein the control circuit further comprises:

a reset circuit electrically connected to a third control signal line, a reset signal line, and the gate of the third transistor, wherein the reset circuit is configured to transmit a reset signal provided by the reset signal line to the gate of the third transistor under an effective level provided by the third control signal line, in such a manner that the gate of the third transistor is reset, the effective level being the first level or the second level.

6. The ultrasonic fingerprint identification circuit according to claim 5, wherein the reset circuit comprises:

a seventh transistor comprising a gate electrically connected to the third control signal line, a first terminal electrically connected to the reset signal line, and a second terminal electrically connected to the gate of the third transistor.

7. The ultrasonic fingerprint identification circuit according to claim 1, wherein the switch unit comprises:

a fifth transistor comprising a gate electrically connected to the one first control signal line, a first terminal electrically connected to the gate of the third transistor, and a second terminal electrically connected to the second terminal of the third transistor; and a sixth transistor comprising a gate and a first terminal that are electrically connected to the one first control signal line, and a second terminal electrically connected to the gate of the third transistor, wherein a type of the fifth transistor is opposite to a type of the third transistor, and a type of the sixth transistor is the same as the type of the third transistor.

8. The ultrasonic fingerprint identification circuit according to claim 1, wherein the third transistor is selected from a group consisting of a low-temperature polycrystalline oxide transistor and an amorphous silicon transistor.

9. The ultrasonic fingerprint identification circuit according to claim 1, wherein the third transistor comprises a third sub-transistor and a fourth sub-transistor that are connected in series, and a gate of the third sub-transistor is electrically connected to a gate of the fourth sub-transistor.

10. The ultrasonic fingerprint identification circuit according to claim 1, wherein the reading circuit comprises:

an eighth transistor comprising a gate electrically connected to the first node, a first terminal electrically connected to a fixed potential signal line, and a second terminal; and a ninth transistor comprising a gate electrically connected to the second control signal line, a first terminal electrically connected to the second terminal of the eighth transistor, and a second terminal of the ninth transistor is electrically connected to the reading signal line.

11. The ultrasonic fingerprint identification circuit according to claim 1, wherein each of the plurality of fingerprint identification units further comprises a storage capacitor, wherein the storage capacitor comprises a first plate electrically connected to the first node, and a second plate electrically connected to a fixed potential signal line.

12. The ultrasonic fingerprint identification circuit according to claim 1, wherein the ultrasonic fingerprint identification sensor comprises:

a first electrode electrically connected to a detection signal line;

a second electrode disposed opposite to the first electrode and electrically connected to the first node; and an ultrasonic material layer located between the first electrode and the second electrode.

13. A driving method of an ultrasonic fingerprint identification circuit, the driving method being used to drive the ultrasonic fingerprint identification circuit according to claim 1, wherein a driving cycle of each of the plurality of fingerprint identification units of the ultrasonic fingerprint identification circuit comprises a preparation period, a pull-up period, and a reading period, and wherein the driving method comprises:

in the preparation period, converting, by the ultrasonic fingerprint identification sensor, the first electrical signal to the ultrasonic signal and radiating the ultrasonic signal towards the finger, providing, by the one first control signal line of a plurality of first control signal lines, the first level, and transmitting, by the control circuit, the second level provided by the composite signal line to the first node;

in the pull-up period, converting, by the ultrasonic fingerprint identification sensor, the ultrasonic signal reflected by the finger to the second electrical signal and transmitting the second electrical signal to the first node, providing, by the composite signal line, the first level, and transmitting, by the control circuit, the first level provided by the composite signal line to the first node, to pull up the potential of the first node; and in the reading period, providing, by one of the plurality of second control signal lines, the first level, and reading, by the reading circuit, the detection signal of the first node.

14. The driving method according to claim 13, wherein the reading period comprises an initial voltage reading period prior to the preparation period, and a detection voltage reading period latter than the pull-up period, wherein the method further comprises:

in the reading period, said providing, by the one second control signal line, the first level, and said reading, by the reading circuit, the detection signal of the first node comprise:

in the initial voltage reading period, providing, by the one second control signal line, the first level, and reading, by the reading circuit, an initial voltage of the first node; and in the detection voltage reading period, providing, by the one second control signal line, the first level, and reading, by the reading circuit, a detection voltage of the first node.

15. The driving method according to claim 14, wherein the driving cycle further comprises an overall resetting period prior to the initial voltage reading period; and wherein the method further comprises:

in the overall resetting period, providing, respectively by the one first control signal line, the one second control signal line and the composite signal line, the first level, and transmitting, by the control circuit, the first level provided by the composite signal line to the first node, in such a manner that the first node is reset.

16. The driving method according to claim 14, wherein the reading circuit comprises:

an eighth transistor comprising a gate electrically connected to the first node, a first terminal electrically connected to a fixed potential signal line, and a gate; and a ninth transistor comprising a gate electrically connected to the second control signal line, a first terminal electrically connected to a second terminal of the eighth transistor, and a second terminal electrically connected to the reading signal line;

wherein in the initial voltage reading period, said reading, by the reading circuit, the initial voltage of the first node comprises: in the initial voltage reading period, providing, by the second control signal line, the first level; and conducting the ninth transistor under the first level to transmit a signal for feeding back a magnitude of an initial voltage of the first node to the reading signal line; and wherein in the detection voltage reading period, said reading, by the reading circuit, a detection voltage of the first node comprises: in the detection voltage reading period, locating the eighth transistor in a saturation region under a potential of the first node; providing, by the second control signal line, the first level; and conducting the ninth transistor under the first level to transmit a signal for feeding back a magnitude of a detection voltage of the first node to the reading signal line.

17. The driving method according to claim 13, wherein the switch unit comprises:

a fourth transistor comprising a gate electrically connected to the one first control signal line, a first terminal electrically connected to the gate of the third transistor, and a second terminal electrically connected to the second terminal of the third transistor, wherein a type of the fourth transistor is opposite to a type of the third transistor; and a diode comprising an anode electrically connected to the one first control signal line, and a cathode electrically connected to the gate of the third transistor;

wherein in the preparation period, said transmitting, by the control circuit, the second level provided by the composite signal line to the first node comprises: in the preparation period, providing, by the one first control signal line, the first level; providing, by the composite signal line, the second level; conducting the diode under the second level and conducting the third transistor under the first level provided by the one first control signal line; and transmitting the second level provided by the composite signal line to the first node; and wherein in the pull-up period, said transmitting, by the control circuit, the first level provided by the composite signal line to the first node, to pull up the potential of the first node comprises: in the pull-up period, providing, by the one first control signal line, the second level; providing, by the composite signal line, the first level; conducting the fourth transistor under the second level and conducting the third transistor under the first level provided by the composite signal line; and transmitting the first level provided by the composite signal line to the first node to pull up a potential of the first node.

18. The driving method according to claim 17, wherein the control circuit further comprises a reset circuit, and the reset circuit is electrically connected to a third control signal line, a reset signal line, and the gate of the third transistor;

wherein the driving cycle further comprises a node resetting period prior to the preparation period; and wherein the method further comprises:

in the node resetting period, providing, by the third control signal line, an effective level, transmitting, by the reset circuit, a reset signal provided by the reset signal line to the gate of the third transistor to reset the gate of the third transistor, the effective level being the first level or the second level.

19. The driving method according to claim 13, wherein the switch unit comprises:

a fifth transistor comprising a gate electrically connected to the one first control signal line, a first terminal electrically connected to the gate of the third transistor, and a second terminal electrically connected to the second terminal of the third transistor, wherein a type of the fifth transistor is opposite to a type of the third transistor types; and a sixth transistor comprising a gate and a first terminal that are electrically connected to the one first control signal line, and a second terminal electrically connected to the gate of the third transistor, wherein a type of the sixth transistor is the same the type of the third transistor;

wherein in the preparation period, said transmitting, by the control circuit, the second level provided by the composite signal line to the first node comprises: in the preparation period, providing, by the one first control signal line, the first level; providing, by the composite signal line, the second level; conducting the sixth transistor under the second level and conducting the third transistor under the first level provided by the one first control signal line; and transmitting the second level provided by the composite signal line to the first node; and wherein in the pull-up period, said transmitting, by the control circuit, the first level provided by the composite signal line to the first node, to pull up the potential of the first node comprises: in the pull-up period, providing, by the one first control signal line, the second level; providing, by the composite signal line, the first level; conducting the fifth transistor under the second level and conducting the third transistor under the first level provided by the composite signal line; and transmitting the first level provided by the composite signal line to the first node to pull up a potential of the first node.

20. The driving method according to claim 13, wherein each of the plurality of fingerprint identification units further comprises a storage capacitor, wherein the storage capacitor comprises a first plate electrically connected to the first node, and a second plate electrically connected to a fixed potential signal line; and wherein the driving method further comprises: in the pull-up period, storing charges of the first node by using the storage capacitor.

21. A display device, comprising:

a display panel having a display area, wherein the display area comprises a main display area and a fingerprint identification area;

the ultrasonic fingerprint identification circuit according to claim 1, wherein the ultrasonic fingerprint identification circuit is disposed in the fingerprint identification area; and a processor electrically connected to a reading signal line and configured to identify fingerprints based on a signal read by the reading signal line.

* * * * *